(12) United States Patent
Chakraborty

(10) Patent No.: US 8,232,564 B2
(45) Date of Patent: Jul. 31, 2012

(54) WAFER LEVEL PHOSPHOR COATING TECHNIQUE FOR WARM LIGHT EMITTING DIODES

(75) Inventor: Arpan Chakraborty, Goleta, CA (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 12/287,764

(22) Filed: Oct. 13, 2008

(65) Prior Publication Data
US 2009/0057690 A1    Mar. 5, 2009

Related U.S. Application Data

(63) Continuation-in-part of application No. 11/656,759, filed on Jan. 22, 2007, and a continuation-in-part of application No. 11/899,790, filed on Sep. 7, 2007.

(51) Int. Cl.
*H01L 33/00*    (2010.01)
*H01L 21/00*    (2006.01)

(52) U.S. Cl. ............... 257/88; 257/98; 257/E33.001; 438/28; 438/29

(58) Field of Classification Search ............ 257/79, 257/88, 98, E33.001; 438/28, 29
See application file for complete search history.

(56) References Cited

U.S. PATENT DOCUMENTS

| | | |
|---|---|---|
| 4,576,796 A | 3/1986 | McCormick |
| 4,733,335 A | 3/1988 | Serizawa et al. ........... 362/503 |
| 4,918,497 A | 4/1990 | Edmond .................... 357/17 |
| 4,935,665 A | 6/1990 | Murata ..................... 313/500 |
| 4,946,547 A | 8/1990 | Palmour et al. ............ 156/643 |
| 4,966,862 A | 10/1990 | Edmond .................... 437/100 |
| 5,027,168 A | 6/1991 | Edmond .................... 357/17 |
| 5,200,022 A | 4/1993 | Kong et al. ................ 156/612 |
| 5,210,051 A | 5/1993 | Carter, Jr. .................. 437/107 |
| 5,277,840 A | 1/1994 | Osaka et al. ............... 252/301 |

(Continued)

FOREIGN PATENT DOCUMENTS
DE    19945672 A1    4/2000
(Continued)

OTHER PUBLICATIONS

Nichia Corp. White LED Part No. NSPW300BS, Specification for Nichia White LED, Model NSPW300BS Jan. 14, 2004.

(Continued)

*Primary Examiner* — Benjamin Sandvik
*Assistant Examiner* — Whitney T Moore
(74) *Attorney, Agent, or Firm* — Koppel, Patrick, Heybl & Philpott

(57) ABSTRACT

Methods for wafer level fabricating of light emitting diode (LED) chips are disclosed with one embodiment of a method according to the present invention comprising providing a plurality of LEDs and then coating of the LEDs with a layer of first conversion material so that at least some light from the LEDs passes through the first conversion material. The light is converted to different wavelengths of light having a first conversion material emission spectrum. The LEDs are then coated with a layer of second conversion material arranged on the first layer of conversion. The second conversion material has a wavelength excitation spectrum, and at least some light from the LEDs passes through the second conversion material and is converted. The first conversion material emission spectrum does not substantially overlap with the second conversion material excitation spectrum. Methods according to the present invention can also be used in wafer level fabrication of LED chips and LED packages with pedestals for electrically contacting the LEDs through the conversion coatings.

21 Claims, 8 Drawing Sheets

U.S. PATENT DOCUMENTS

| | | | |
|---|---|---|---|
| 5,338,944 A | 8/1994 | Edmond et al. | 257/76 |
| RE34,861 E | 2/1995 | Davis et al. | 437/100 |
| 5,393,993 A | 2/1995 | Edmond et al. | 257/77 |
| 5,416,342 A | 5/1995 | Edmond et al. | 257/76 |
| 5,523,589 A | 6/1996 | Edmond et al. | 257/77 |
| 5,604,135 A | 2/1997 | Edmond et al. | 437/22 |
| 5,614,131 A | 3/1997 | Mukerji et al. | 264/1.9 |
| 5,631,190 A | 5/1997 | Negley | 438/33 |
| 5,739,554 A | 4/1998 | Edmond et al. | 257/103 |
| 5,766,987 A | 6/1998 | Mitchell et al. | 438/126 |
| 5,813,753 A | 9/1998 | Vriens | |
| 5,858,278 A | 1/1999 | Itoh et al. | 252/301 |
| 5,912,477 A | 6/1999 | Negley | 257/95 |
| 5,923,053 A | 7/1999 | Jakowetz et al. | 257/95 |
| 5,959,316 A | 9/1999 | Lowery | 257/98 |
| 5,998,925 A | 12/1999 | Shimizu | 313/503 |
| 6,001,671 A | 12/1999 | Fjelstad | 438/112 |
| 6,066,861 A | 5/2000 | Horn et al. | 257/99 |
| 6,069,440 A | 5/2000 | Shimizu et al. | 313/486 |
| 6,087,202 A | 7/2000 | Exposito et al. | 438/113 |
| 6,120,600 A | 9/2000 | Edmond et al. | 117/89 |
| 6,132,072 A | 10/2000 | Turnbull et al. | 362/494 |
| 6,139,304 A | 10/2000 | Centofante | 425/121 |
| 6,153,448 A | 11/2000 | Takahashi et al. | 438/114 |
| 6,187,606 B1 | 2/2001 | Edmond et al. | 438/46 |
| 6,201,262 B1 | 3/2001 | Edmond et al. | 257/77 |
| 6,252,254 B1 | 6/2001 | Soules et al. | 257/89 |
| 6,329,224 B1 | 12/2001 | Nguyen | |
| 6,331,063 B1 | 12/2001 | Kamada et al. | 362/237 |
| 6,338,813 B1 | 1/2002 | Hsu et al. | 264/272.14 |
| 6,366,018 B1 | 4/2002 | Garbuzov | |
| 6,376,277 B2 | 4/2002 | Corisis | 438/106 |
| 6,404,125 B1 | 6/2002 | Garbuzou | 313/499 |
| 6,501,100 B1 | 12/2002 | Srivastava | |
| 6,522,065 B1 | 2/2003 | Srivastava | |
| 6,531,328 B1 | 3/2003 | Chen | 438/26 |
| 6,583,444 B2 | 6/2003 | Fjelstad | 257/82 |
| 6,624,058 B1 | 9/2003 | Kazama | 438/612 |
| 6,642,652 B2 | 11/2003 | Collins, III | 313/512 |
| 6,653,765 B1 | 11/2003 | Levinson | |
| 6,686,676 B2 | 2/2004 | McNulty et al. | |
| 6,733,711 B2 | 5/2004 | Durocher et al. | 264/272.14 |
| 6,744,196 B1 | 6/2004 | Jeon | 313/498 |
| 6,759,266 B1 | 7/2004 | Hoffman | 438/64 |
| 6,791,119 B2 | 9/2004 | Slater, Jr. et al. | 257/99 |
| 6,791,259 B1 | 9/2004 | Stokes | |
| 6,793,371 B2 | 9/2004 | Lamke et al. | 362/241 |
| 6,812,500 B2 | 11/2004 | Reeh et al. | 257/98 |
| 6,853,010 B2 | 2/2005 | Slater, Jr. et al. | 257/98 |
| 6,860,621 B2 | 3/2005 | Bachl et al. | 362/373 |
| 6,919,683 B1 | 7/2005 | Jang | 313/503 |
| 6,921,929 B2 | 7/2005 | LeBoeuf et al. | 257/100 |
| 6,939,481 B2 | 9/2005 | Srivastava | |
| 6,958,497 B2 | 10/2005 | Emerson et al. | 257/94 |
| 7,023,019 B2 | 4/2006 | Maeda et al. | |
| 7,029,935 B2 | 4/2006 | Negley et al. | |
| 7,049,159 B2 | 5/2006 | Lowery | 438/22 |
| 7,078,737 B2 | 7/2006 | Yuri | |
| 7,183,586 B2 | 2/2007 | Ichihara | |
| 7,183,587 B2 | 2/2007 | Negley et al. | 257/99 |
| 7,202,598 B2 | 4/2007 | Juestel et al. | 313/503 |
| 7,217,583 B2 | 5/2007 | Negley et al. | |
| 7,286,296 B2 | 10/2007 | Chaves et al. | 359/641 |
| 7,601,550 B2 | 10/2009 | Bogner | |
| 7,714,342 B2 | 5/2010 | Lee et al. | 257/98 |
| 2001/0000622 A1 | 5/2001 | Reeh | |
| 2002/0001869 A1 | 1/2002 | Fjelstad | |
| 2002/0006040 A1 | 1/2002 | Kamada et al. | |
| 2002/0056847 A1 | 5/2002 | Uemura et al. | |
| 2002/0057057 A1 | 5/2002 | Sorg | |
| 2002/0070449 A1 | 6/2002 | Yagi et al. | |
| 2002/0079837 A1 | 6/2002 | Okazaki | |
| 2002/0096789 A1 | 7/2002 | Bolken | |
| 2002/0105266 A1 | 8/2002 | Juestel et al. | |
| 2002/0123164 A1 | 9/2002 | Slater, Jr. et al. | |
| 2002/0185965 A1 | 12/2002 | Collins, III et al. | |
| 2003/0006418 A1 | 1/2003 | Emerson et al. | |
| 2003/0038596 A1 | 2/2003 | Ho | |
| 2003/0066311 A1 | 4/2003 | Li et al. | |
| 2003/0121511 A1 | 7/2003 | Hashimura et al. | |
| 2003/0207500 A1 | 11/2003 | Pichler et al. | |
| 2004/0004435 A1 | 1/2004 | Hsu | |
| 2004/0012958 A1 | 1/2004 | Hashimoto et al. | |
| 2004/0037949 A1 | 2/2004 | Wright | |
| 2004/0038442 A1 | 2/2004 | Kinsman | |
| 2004/0041159 A1* | 3/2004 | Yuri et al. | 257/79 |
| 2004/0041222 A1 | 3/2004 | Loh | |
| 2004/0056260 A1 | 3/2004 | Slater, Jr. et al. | |
| 2004/0106234 A1 | 6/2004 | Sorg et al. | |
| 2004/0124429 A1* | 7/2004 | Stokes et al. | 257/98 |
| 2004/0164307 A1 | 8/2004 | Mueller-Mach et al. | |
| 2004/0173806 A1 | 9/2004 | Chua | |
| 2004/0188697 A1 | 9/2004 | Brunner et al. | |
| 2004/0245530 A1 | 12/2004 | Kameyama | |
| 2005/0001225 A1 | 1/2005 | Yoshimura et al. | |
| 2005/0002168 A1 | 1/2005 | Narhi et al. | |
| 2005/0006651 A1 | 1/2005 | LeBoeuf et al. | 257/79 |
| 2005/0051782 A1 | 3/2005 | Negley et al. | |
| 2005/0072981 A1 | 4/2005 | Suenaga | 257/88 |
| 2005/0122031 A1 | 6/2005 | Itai | |
| 2005/0184305 A1 | 8/2005 | Ueda | |
| 2005/0184638 A1* | 8/2005 | Mueller et al. | 313/485 |
| 2005/0196886 A1 | 9/2005 | Jager et al. | |
| 2005/0211991 A1 | 9/2005 | Mori et al. | |
| 2005/0265404 A1 | 12/2005 | Ashdown | |
| 2005/0280894 A1 | 12/2005 | Hartkop et al. | 359/464 |
| 2006/0001046 A1 | 1/2006 | Batres et al. | |
| 2006/0091788 A1 | 5/2006 | Yan | |
| 2006/0145170 A1 | 7/2006 | Cho | |
| 2006/0157721 A1 | 7/2006 | Tran et al. | |
| 2006/0267042 A1 | 11/2006 | Izuno | |
| 2006/0284195 A1 | 12/2006 | Nagai | |
| 2007/0012940 A1 | 1/2007 | Suh et al. | |
| 2007/0034995 A1 | 2/2007 | Kameyama | |
| 2007/0096131 A1 | 5/2007 | Chandra | |
| 2007/0158668 A1 | 7/2007 | Tarsa et al. | |
| 2007/0158669 A1 | 7/2007 | Lee et al. | |
| 2007/0165403 A1 | 7/2007 | Park | 362/247 |
| 2007/0215890 A1* | 9/2007 | Harbers et al. | 257/98 |
| 2007/0259206 A1* | 11/2007 | Oshio | 428/690 |
| 2008/0006815 A1 | 1/2008 | Wang et al. | |
| 2008/0173884 A1 | 7/2008 | Chitnis et al. | 257/98 |
| 2008/0179611 A1 | 7/2008 | Chitnis et al. | |
| 2008/0203410 A1 | 8/2008 | Brunner et al. | |
| 2008/0283865 A1 | 11/2008 | Yoo | |

FOREIGN PATENT DOCUMENTS

| | | |
|---|---|---|
| DE | 102005062514 | 3/2007 |
| EP | 0732740 A2 | 9/1996 |
| EP | 1059678 | 12/2000 |
| EP | 1 138 747 A2 | 10/2001 |
| EP | 1138747 | 10/2001 |
| EP | 1198016 A2 | 4/2002 |
| EP | 1724848 | 11/2006 |
| FR | 2704690 | 11/1994 |
| JP | 2000002802 | 1/2000 |
| JP | 200164937 | 6/2000 |
| JP | 2000208820 A | 7/2000 |
| JP | 2002009097 A | 1/2002 |
| JP | 2002-050799 | 2/2002 |
| JP | 2002050799 | 2/2002 |
| JP | 2002-093830 | 3/2002 |
| JP | 2003-115614 | 4/2003 |
| JP | 2003-170465 | 6/2003 |
| JP | 2003-258011 | 9/2003 |
| JP | 2003318448 | 11/2003 |
| JP | 2005298817 | 10/2005 |
| JP | 2006054209 | 2/2006 |
| KR | 2004-0017926 | 3/2004 |
| WO | WO0033390 | 6/2000 |
| WO | WO0124283 | 4/2001 |
| WO | WO 03/021668 | 3/2003 |
| WO | WO 2005101909 | 10/2005 |
| WO | WO 2006033695 A2 | 3/2006 |
| WO | WO 2006036251 A1 | 4/2006 |
| WO | WO 2006/065015 | 6/2006 |
| WO | WO2008003176 A1 | 1/2008 |

OTHER PUBLICATIONS

Nichia Corp. White LED Part No. NSPW312BS, Specification for Nichia White LED, Model NSPW312BS Jan. 14, 2004.
Cree EZ700 and EZ1000 EZBright LED chip data sheets.
NPO-30394 Electrophoretic Deposition for Fabricating Microbatteries p. 1-2, NASA Tech Briefs Issue May 3, 2003.
Patent Abstracts of Japan 2004-221185, Aug. 5, 2004.
Patent Abstracts of Japan 11-040858, Feb. 12, 1999.
Patent Abstracts of Japan 2001-181613, Jul. 3, 2001.
JP 2005 033138 A, Feb. 2005 Iwao.
Patent Abstracts of Japan, 2003-258011, Sep. 12, 2003.
Patent Abstracts of Japan, 2002-093830, Mar. 29, 2002.
Office Action from U.S. Appl. No. 11/595,720, dated May 14, 2010.
Office Action from U.S. Appl. No. 11/827,626, dated Oct. 7, 2010.
Office Action from U.S. Appl. No. 12/008,477, dated Oct. 7, 2010.
Office Action from U.S. Appl. No. 11/881,683, dated May 12, 2010.
Office Action from U.S. Appl. No. 11/899,790, dated Jun. 2, 2010.
Office Action from U.S. Appl. No. 11/982,276, dated Aug. 19, 2010.
Office Action from U.S. Appl. No. 12/077,638, dated Jul. 7, 2010.
Office Action from U.S. Appl. No. 10/666,399, dated May 11, 2010.
Response to OA from U.S. Appl. No. 12/077,638, OA dated Dec. 8, 2009, filed Feb. 26, 2010.
Response to OA from U.S. Appl. No. 11/982,276, OA dated Dec. 7, 2009, filed Feb. 5, 2010.
Response to OA from U.S. Appl. No. 11/982,276, OA dated Aug. 19, 2010, filed Nov. 2, 2010.
Office Action from U.S. Appl. No. 11/982,276, dated Feb. 18, 2010.
Office Action from U.S. Appl. No. 11/398,214, dated Nov. 12, 2010.
Office Action from U.S. Appl. No. 11/656,759, dated May 21, 2010.
Office Action from U.S. Appl. No. 11/656,759, dated Mar. 9, 2011.
Office Action from U.S. Appl. No. 12/077,638, dated Dec. 21, 2010.
Response to OA from U.S. Appl. No. 11/595,720, dated May 14, 2010, filed Jul. 6, 2010.
Office Action from U.S. Appl. No. 12/077,638, dated Sep. 22, 2010.
Response to Office Action U.S. Appl. No. 11/398,214, OA dated Dec. 11, 2009, Resp. filed Mar. 2, 2010.
Response to Office Action U.S. Appl. No. 10/666,399, OA dated May 11, 2010, Resp. filed Aug. 11, 2010.
Response to Office Action U.S. Appl. No. 12/008,477, OA dated Mar. 1, 2010, Resp. filed May 26, 2010.
Response to Office Action U.S. Appl. No. 11/982,276, OA dated Mar. 1, 2010, Resp. filed Jun. 21, 2010.
Response to Office Action U.S. Appl. No. 11/881,683, OA dated May 12, 2010, Resp. filed Aug. 3, 2010.
Response to Office Action U.S. Appl. No. 12/077,638, OA dated Jul. 7, 2010, Resp. filed Aug. 30, 2010.
Response to Office Action U.S. Appl. No. 11/656,759, OA dated Nov. 25, 2009, Resp. filed Apr. 26, 2010.
Response to Office Action U.S. Appl. No. 11/899,790, OA dated Jun. 2, 2010, Resp. filed Nov. 1, 2010.
Response to Office Action U.S. Appl. No. 10/666,399, OA dated Dec. 22, 2009, Resp. filed Mar. 22, 2010.
Office Action from U.S. Appl. No. 11/881,683, dated Oct. 14, 2010.
Office Action from U.S. Appl. No. 11/899,790, dated Mar. 21, 2011.
Office Action from U.S. Appl. No. 11/982,276, dated Mar. 25, 2010.
Office Action from U.S. Appl. No. 11/827,626, dated Apr. 1, 2011.
Notice of Allowance from U.S. Appl. No. 10/666,399, dated Oct. 14, 2010.
Office Action from U.S. Appl. No. 11/398,214, dated Dec. 11, 2009.
Office Action from U.S. Appl. No. 12/506,989, dated Jul. 23, 2010.
Office Action from U.S. Appl. No. 10/666,399, dated Dec. 22, 2009.
Office Action from U.S. Appl. No. 12/506,989, dated Mar. 8, 2011.
Office Action from U.S. Appl. No. 12/008,477, dated Mar. 1, 2010.
Office Action from U.S. Appl. No. 11/656,759, dated Nov. 25, 2009.
Office Action from U.S. Appl. No. 11/881,683, dated Feb. 5, 2010.
Notice of Rejection (Final) in Japanese Patent Application No. 2006-526964 dated Feb. 22, 2011.
Minutes of Oral Proceedings (EPO Form 2009) in European Patent Application No. 05808825.3 dated Feb. 3, 2011.
Summons to Attend Oral Proceedings in European Patent Application No. 05808825.3 dated Feb. 3, 2011.
Office Action from Taiwan Patent Application No. 093128231 issued Apr. 21, 2011.
Second Office Action for Chinese Patent Application No. 200780050127.2 dated Jun. 15, 2011.
International Preliminary Examination Report for PCT Application No. PCT/US07/24366 mailed Jun. 29, 2011.
International Preliminary Examination Report for PCT Application No. PCT/US07/24367 mailed Jun. 29, 2011.
Decision to Refuse a European Patent Application regarding EP 05 808 825.3 dated Jun. 14, 2011.
Office Action in Korean Patent Application No. 10-2007-7008694 mailed Aug. 7, 2011.
Office Action U.S. Appl. No. 12/008,477, mailed Apr. 12, 2011.
Response to Office Action U.S. Appl. No. 12/008,477, filed Jun. 27, 2011.
Office Action U.S. Appl. No. 11/899,790, mailed Jul. 27, 2011.
Response to Office Action U.S. Appl. No. 11/899,790, filed Nov. 22, 2011.
Office Action U.S. Appl. No. 12/506,989, mailed on Jul. 20, 2011.
Response to Office Action U.S. Appl. No. 12/506,989, filed Nov. 21, 2011.
Office Action U.S. Appl. No. 11/956,989, mailed Apr. 16, 2010.
Response to Office Action U.S. Appl. No. 11/956,989, filed Jun. 14, 2010.
Response to Office Action U.S. Appl. No. 11/956,989, filed Jul. 14, 2010.
Office Action U.S. Appl. No. 13/072,371, mailed Oct. 5, 2011.
Response to Office Action U.S. Appl. No. 13/072,371, filed Dec. 23, 2011.
Office Action U.S. Appl. No. 11/656,759, mailed Sep. 23, 2011.
Response to Office U.S. Appl. No. 11/656,759, filed Jan. 16, 2012.
Office Action U.S. Appl. No. 12/008,477, mailed Sep. 19, 2011.
Response to Office U.S. Appl. No. 12/008,477, filed Jan. 25, 2012.
Office Action U.S. Appl. No. 12/862,640, mailed Aug. 19, 2011.
Response to Office Action U.S. Appl. No. 12/862,640, filed Feb. 21, 2012.
Office Action U.S. Appl. No. 12/387,764, mailed Oct. 26, 2011.
Response to Office Action U.S. Appl. No. 12/287,764, filed Mar. 6, 2012.
Office Action U.S. Appl. No. 12/506,989, mailed Dec. 27, 2011.
Office Action U.S. Appl. No. 11/899,790, mailed Jan. 12, 2012.
Response to Office Action U.S. Appl. No. 11/899,790. filed Mar. 8, 2012.
Office Action U.S. Appl. No. 12/862,640, mailed Mar. 9, 2012.
Office Action U.S. Appl. No. 12/287,764, mailed Jan. 13, 2011.
Response to Office Action U.S. Appl. No. 12/287,764, filed May 5, 2011.

* cited by examiner

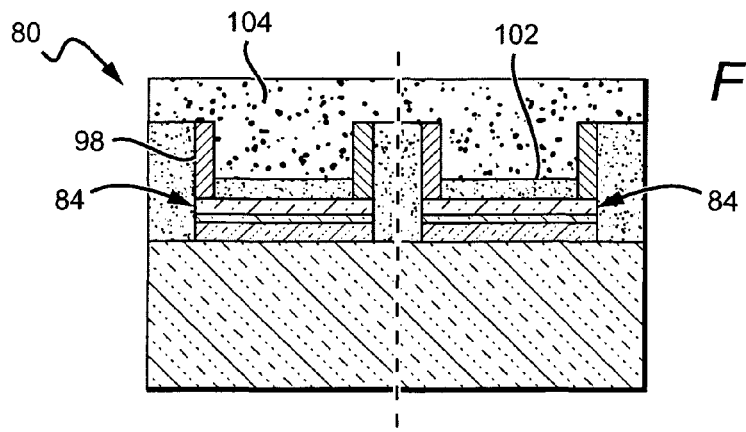
*FIG. 6e*
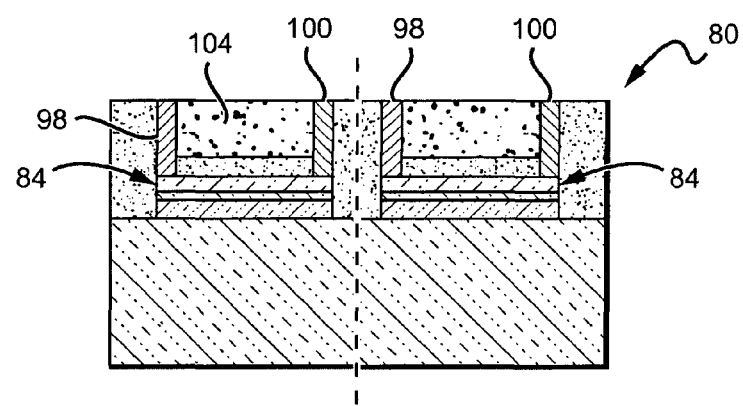
*FIG. 6f*
*FIG. 6g*
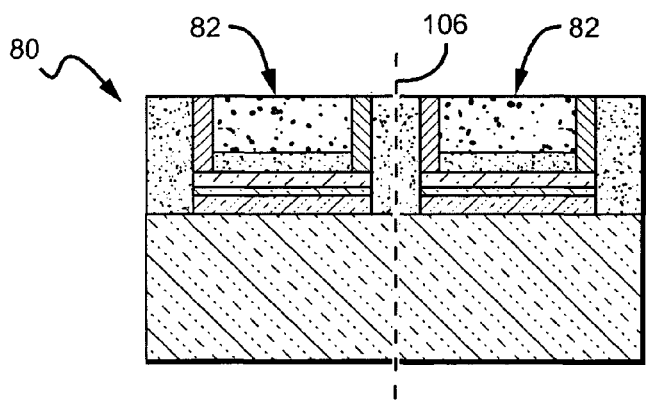
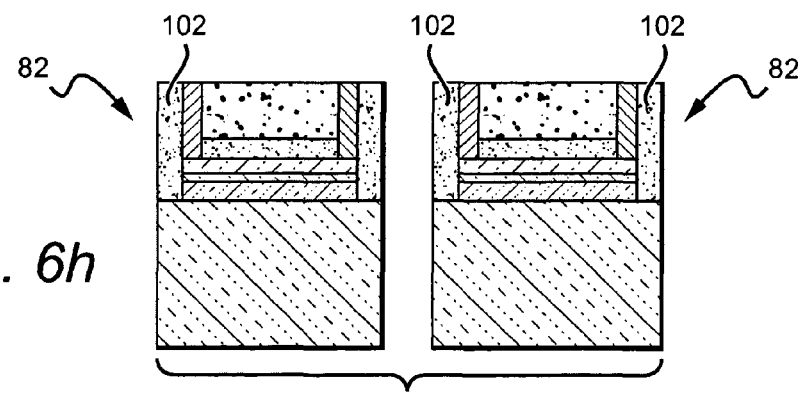
*FIG. 6h*

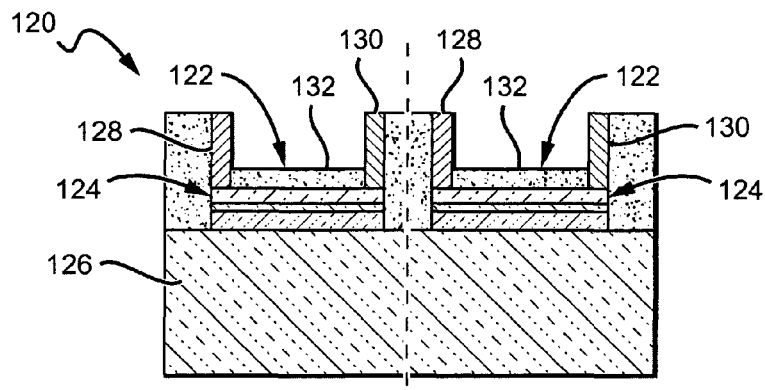
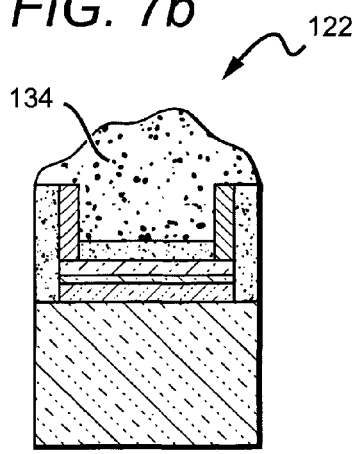
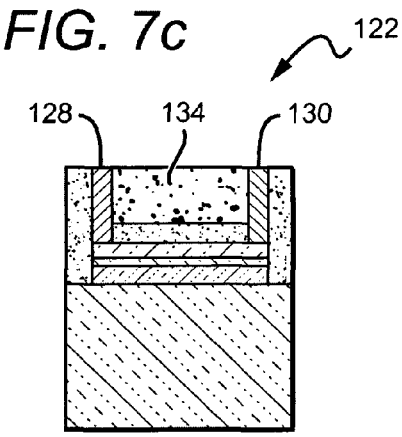
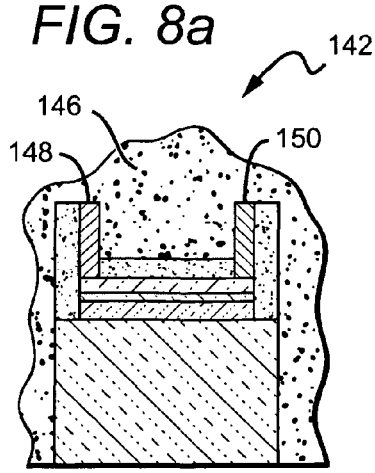
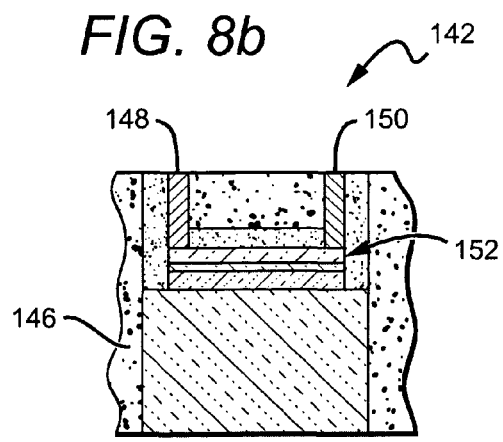

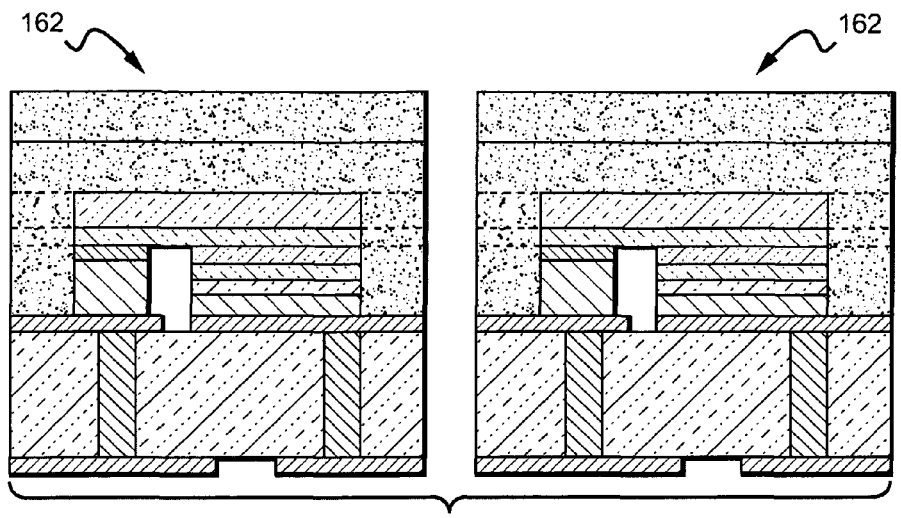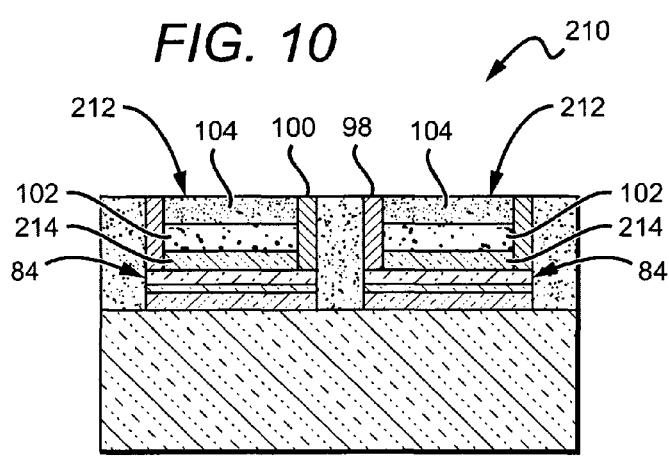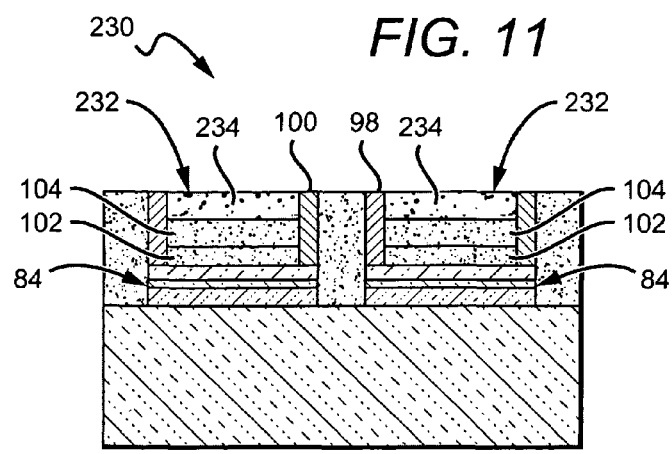

WAFER LEVEL PHOSPHOR COATING TECHNIQUE FOR WARM LIGHT EMITTING DIODES

This application is a continuation-in-part of and claims the benefit of U.S. Patent Application Publication Numbers 2008/0173884 filed on Jan. 22, 2007, and 2008/0179611 filed on Sep. 7, 2007, both to Chitnis et al.

BACKGROUND OF THE INVENTION

1. Field of the Invention

This invention relates to methods for fabricating solid state emitters and in particular methods for tuning the emission characteristics of light emitting diodes coated by a conversion material.

2. Description of the Related Art

Light emitting diodes (LED or LEDs) are solid state devices that convert electric energy to light, and generally comprise one or more active layers of semiconductor material sandwiched between oppositely doped layers. When a bias is applied across the doped layers, holes and electrons are injected into the active layer where they recombine to generate light. Light is emitted from the active layer and from all surfaces of the LED.

Conventional LEDs cannot generate white light from their active layers. Light from a blue emitting LED has been converted to white light by surrounding the LED with a yellow phosphor, polymer or dye, with a typical phosphor being cerium-doped yttrium aluminum garnet (Ce:YAG). [See Nichia Corp. white LED, Part No. NSPW300BS, NSPW312BS, etc.; Cree® Inc. EZBright™ LEDs, XThin™ LEDs, etc.; See also U.S. Pat. No. 5,959,316 to Lowrey, "Multiple Encapsulation of Phosphor-LED Devices"]. The surrounding phosphor material "downconverts" the wavelength of some of the LED's blue light, changing its color to yellow. In other devices the light can be converted to green, yellow, orange or red or a combination thereof. Some of the blue light passes through the phosphor without being changed while a substantial portion of the light is downconverted. The LED emits both blue and yellow and/or red light, which combine to provide a white light. In another approach light from a violet or ultraviolet emitting LED has been converted to white light by surrounding the LED with multicolor phosphors or dyes.

One conventional method for coating an LED with a phosphor layer utilizes a syringe or nozzle for injecting a phosphor mixed with epoxy resin or silicone polymers over the LED. Using this method, however, it can be difficult to control the phosphor layer's geometry and thickness. As a result, light emitting from the LED at different angles can pass through different amounts of conversion material, which can result in an LED with non-uniform color temperature as a function of viewing angle.

Another conventional method for coating an LED is by stencil printing, which is described in European Patent Application EP 1198016 A2 to Lowery. Multiple light emitting semiconductor devices are arranged on a substrate with a desired distance between adjacent LEDs. The stencil is provided having openings that align with the LEDs, with the holes being slightly larger than the LEDs and the stencil being thicker than the LEDs. A stencil is positioned on the substrate with each of the LEDs located within a respective opening in the stencil. A composition is then deposited in the stencil openings, covering the LEDs, with a typical composition being a phosphor in a silicone polymer that can be cured by heat or light. After the holes are filled, the stencil is removed from the substrate and the stenciling composition is cured to a solid state.

Like the syringe method above, using the stencil method can be difficult to control the geometry and layer thickness of the phosphor containing polymer. The stenciling composition may not fully fill the stencil opening such that the resulting layer is not uniform. The phosphor containing composition can also stick to the stencil opening which reduces the amount of composition remaining on the LED. The stencil openings may also be misaligned to the LED. These problems can result in LEDs having non-uniform color temperature and LEDs that are difficult to consistently reproduce with the same or similar emission characteristics.

Many of the above coating processes focus on coating at the LED chip level or at the package level. There has been recent interest in coating LEDs with a phosphor at the wafer level instead of the chip level to reduce the cost and complexity of fabrication. With these approaches one challenge is accessing the wire bond pad on the device after the coating process. Accessing the wire bond by standard wafer fabrication techniques is difficult with typical silicone binding material, as well as other binder materials such as epoxies or glass. Silicones are not compatible with commonly used wafer fabrication materials such as acetone, as well as some developers and resist strippers. This can limit the options and choices of process steps for the particular silicones. Silicones are also cured at high temperature (greater than 150° C.), which is beyond the glass transition temperature of commonly used photoresists. Cured silicone films with phosphor are also difficult to etch and have a very slow etch rate in chlorine and $CF_4$ plasma, and wet etching of cured silicones is typically inefficient.

LEDs across a wafer can also have different emission characteristics or color spread. FIG. 1 shows one example of a wavelength emission map 10 for a wafer of blue emitting LEDs showing wavelength variations across the wafer, and each wafer can have its own unique emission map. In the map shown, the wavelength distribution is approximately 450 to 460 nm, although other wafers can experience different distributions in different wafer areas. This distribution can result from different factors such as variations in the epitaxial material during growth of the LEDs, or from variations in the flatness (i.e. bow) of the growth substrate.

The wafer can be coated with a conversion material (i.e. phosphor) using one of the methods described above, and FIG. 2 shows a conversion material thickness map 20 following coating. In some fabrication processes the coating can be planarized using known methods. The thickness of the coating can vary across the wafer due to different factors such as variations in the thickness of the underlying wafer and in planarizing variations. In the embodiment shown the wafer experiences a total thickness variation of approximately 3 μm. The wavelength emission variations of the LEDs and thickness variations of the conversion material across the wafer can result in a spread of emission wavelengths or color points of the LED chips singulated from the wafer. This spread can exacerbate by phosphor loading variations or concentrations across the wafer.

The human eye is relatively sensitive to variations in emission wavelengths and can detect relatively small differences in emission wavelengths or color. Perceptible variations in color emitted by packages designed to emit a single color of light can reduce customer satisfaction and reduce overall acceptance of LED packages for commercial uses. In an effort to provide LEDs that emit light of the same or similar wavelength, the LEDs can be tested and sorted by color or brightness. This process is generally known in the art as binning. Each bin typically contains LEDs from one color and brightness group and is typically identified by a bin code. White emitting LEDs can be sorted by chromaticity (color) and luminous flux (brightness). Color LEDs can be sorted by dominant wavelength, and luminous flux, or in the case of certain colors such as royal blue, by radiant flux. LEDs can be shipped, such as on reels, containing LEDs from one bin and are labeled with the appropriate bin code.

There is also interest in optimizing the emission efficiency of LEDs that are coated at the wafer level. For certain LEDs it is common to provide more than one phosphor mixed in the phosphor coating. For warm white emitting LEDs a blue emitting LED can be coated with a yellow and red phosphor mixture, such that the end LED package emits a warm white light combination of blue, yellow and red. These different phosphors can have different excitation and re-emission spectrums, and FIG. 3 is a graph 30 showing the excitation spectrum 32 of a red phosphor and the emission spectrum 34 of a yellow phosphor. The lower portion of red phosphor excitation spectrum 32 overlaps with upper portion of the yellow phosphor emission spectrum 34. That is, the upper wavelengths for emission from the yellow phosphor can be the same as the lower wavelengths that are absorbed by the red phosphor. This can result in a certain percentage of light that is absorbed by the yellow phosphor and re-emitted as yellow light being absorbed again by the red phosphor. Each phosphor absorption and re-emission results in Stokes losses and the overlap of the spectrum as shown in FIG. 3 can reduce the overall emission efficiency by greater than 30%.

When the phosphor mixture is applied to the LED it can be in direct contact with or close to the LED's semiconductor layers such that heat from the LED spreads to the phosphor. The different phosphors can react differently to the LED heat and some can degrade from the heat. As one example, certain yellow phosphors such as YAG can be more sensitive to heat compared to red phosphors and the efficacy of these YAG phosphors can degrade over time.

SUMMARY OF THE INVENTION

The present invention discloses new methods for fabricating semiconductor devices such as LED chips at the wafer level, and discloses LED chips and LED chip wafers fabricated using the methods. One embodiment of a method according to the present invention for fabricating light emitting diode (LED) chips comprises providing a plurality of LEDs and coating the LEDs with a layer of first conversion material so that at least some light from the LEDs passes through the first conversion material. The light is converted to different wavelengths of light having a first conversion material emission spectrum. The LEDs are then coated with a layer of second conversion material arranged on the first layer of conversion, with the second conversion material being different from the first conversion material. The second conversion material has a wavelength excitation spectrum, and at least some light from the LEDs passes through the second conversion material and is converted. The first conversion material emission spectrum does not substantially overlap with the second conversion material excitation spectrum.

Another embodiment of a method for fabricating LED chips according to the present invention comprises providing a plurality of LEDs and depositing pedestals on the LEDs, with each of the pedestals in electrical contact with one of the LEDs. The LEDs are coated with a layer of first conversion material so that at least some light from the LEDs passes through the first conversion material and is converted to a different wavelength. The layer of first conversion material is planarized leaving at least some of the first conversion material on the LEDs while exposing at least some of the buried pedestals. The LEDs are coated with a layer of second conversion material arranged on the first conversion material, the second conversion material being different from the first conversion material. At least some light from the LEDs passes through the second conversion material and is converted. The layer of second conversion material is planarized leaving at least some of the second conversion material on the LEDs while exposing at least some of the buried pedestals.

One embodiment of an LED chip wafer according to the present invention comprises a plurality of LEDs on a wafer and a layer of first conversion material on the LEDs so that at least some light from the LEDs passes through the first conversion material and is converted to a different wavelength of light in a first emission spectrum. A layer of second conversion material having a second excitation spectrum is arranged on the first layer of conversion, wherein at least some light from the LEDs passes through the second conversion material and is converted. The first emission spectrum does not substantially overlap with the second excitation spectrum.

One embodiment of an LED chip according to the present invention comprises an LED and a pedestal in electrical contact with the LED. A coating of first conversion material is included at least partially covering the LED and a coating of a second conversion material is included on the coating of a first conversion material and is at least partially covering the LED. The second conversion material being different than the first conversion material and the pedestal extends through and to the surface of the coatings, and is exposed at the surface of the coatings.

An LED package according to the present invention comprises an LED and a pedestal on and in electrical contact with the LED. A coating of first conversion material is included on and at least partially covers the LED. A coating of second conversion material is included on the coating of first conversion material and at least partially covers the LED. The pedestal extends through and to the surface of the coating and is exposed at the surface of the coatings. Package leads are included, at least one of which is in electrical connection with the pedestal. An encapsulation surrounds the LED chip and the electrical connection.

These and other aspects and advantages of the invention will become apparent from the following detailed description and the accompanying drawings which illustrate by way of example the features of the invention.

BRIEF DESCRIPTION OF THE DRAWINGS

FIG. 6e is a sectional view of the LED chip wafer in FIG. 6d at a subsequent fabrication step;

FIG. 6f is a sectional view of the LED chip wafer in FIG. 6e at a subsequent fabrication step;

FIG. 6g is a sectional view of the LED chip wafer in FIG. 6f at a subsequent fabrication step;

FIG. 6h is a sectional view of LED chips singulated from the LED chip wafer in FIG. 6b.

FIG. 7a is a sectional view of another embodiment of an LED chip wafer fabricated according to the present invention;

FIG. 7b is a sectional view of an LED chip singulated from the LED chip wafer in FIG. 7a;

FIG. 7c is a sectional view of the LED chip in FIG. 7b at a subsequent fabrication step;

FIG. 8a is a sectional view of an LED chip singulated from the LED chip wafer in FIG. 7a;

FIG. 8b is a sectional view of the LED chip in FIG. 8a at a subsequent fabrication step;

FIG. 9c is a sectional view of LED chips singulated from the LED chip wafer in FIG. 9b;

FIG. 10 is a sectional view of another embodiment of an LED chip wafer according to the present invention; and FIG. 11 is a sectional view of still another embodiment of an LED chip wafer according to the present invention.

DETAILED DESCRIPTION OF THE INVENTION

Figure 1:
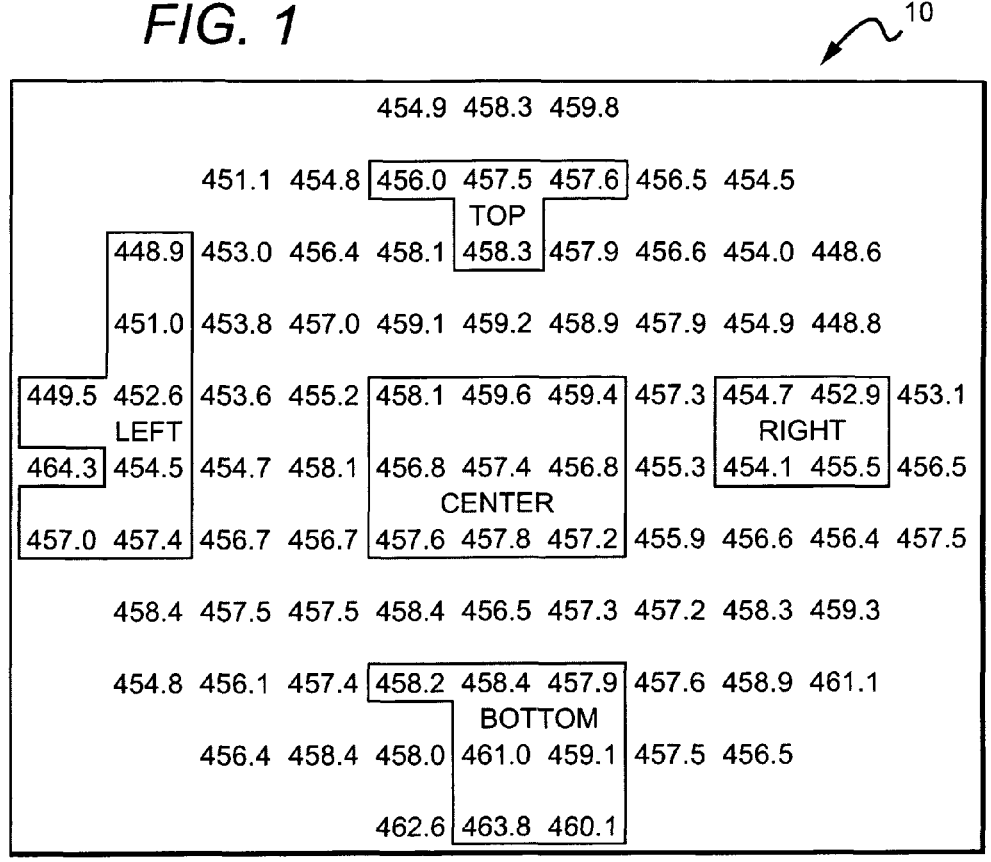
FIG. 1 shows one embodiment of a wavelength emission map across an LED wafer having blue emitting LEDs.
Figure 2:
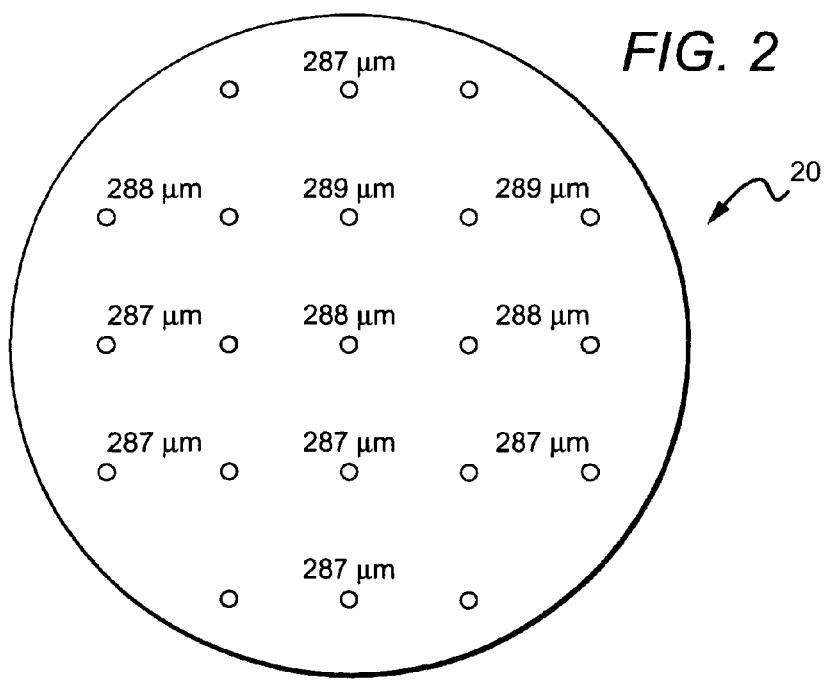
FIG. 2 shows one embodiment of a conversion material thickness map across an LED wafer.
Figure 3:
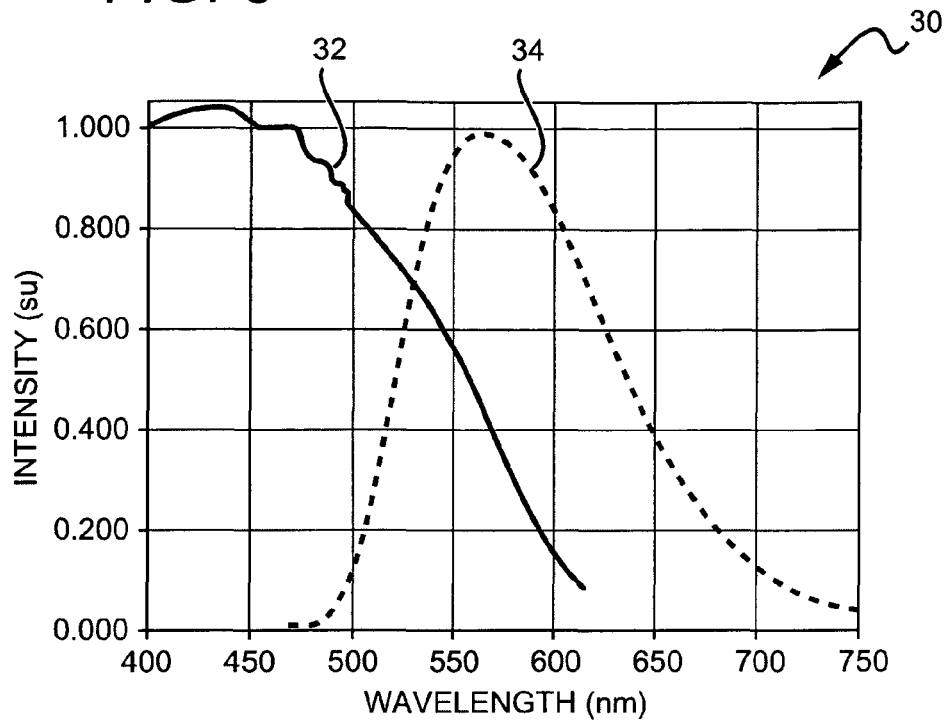
FIG. 3 is a graph showing one embodiment of the emission spectrum of a red phosphor and the emission spectrum of a yellow phosphor.

The present invention discloses new methods for fabricating semiconductor devices such as LED chips, with one embodiment of a fabrication method according to the present invention providing LED chip fabrication at the wafer level. The present invention also discloses LED chips and LED packages fabricated using the methods. Different embodiments of the present invention disclose sequential coating methods that provide two or more coatings or layers of conversion material over LEDs. In one embodiment this can be done at the wafer level. The methods according to the present invention are particularly applicable to fabricating LED chips that emit a warm white light, which typically requires covering LEDs with two or more phosphors such as yellow and red phosphors. As described above, the presence of the two phosphors in the same layer can result in re-absorption losses due to a portion of the emission spectra from one of the phosphors overlapping with the excitation spectrum of one of the other phosphors.

To reduce these losses, separate phosphor coatings or layers are provided over the LEDs, with each of the layers having one or more phosphors. For each of the layers, the absorption wavelength spectrum does not overlap with the emission spectrum of the phosphor in the layer or layers below it, or the overlap is minimized. Light from the LED that is absorbed and re-emitted by the phosphors in the different layers is not re-absorbed by subsequent layers, or the re-absorption is minimized. In one embodiment, a blue emitting LED is covered by two phosphor layers at the wafer level with a red phosphor layer sandwiched between the blue LED and the yellow phosphor. With the yellow phosphor on the red phosphor, LED light that is absorbed and re-emitted by the yellow phosphor has a very small chance of interacting with the red phosphor layer. This minimizes the chance that the re-emitted yellow light would be re-absorbed by the red phosphor.

The present invention also provides methods for sequentially coating LEDs with two or more conversion coatings or layers at the wafer level while still allowing for contacting LED chips that are singulated from the wafer. In one such embodiment the LEDs can have one or more pedestals that extend from the contacts on the LEDs up through the conversion layers. Electrical contact is made to the LEDs through the one or more pedestals. In some embodiments the thickness of the layers can be varied during or after wafer fabrication to control the emission characteristics of the LED chips. The thickness can be controlled across the wafer using methods such as grinding, planarizing or sandblasting. Additional color tuning processes can be used to remove phosphor over individual LEDs or regions of LEDs to further control or vary the emission characteristics of the LED chips.

The present invention is described herein with reference to certain embodiments but it is understood that the invention can be embodied in many different forms and should not be construed as limited to the embodiments set forth herein. In particular, the present invention is described below in regards to coating LEDs with a down-converter coating that typically comprises a phosphor loaded binder ("phosphor/binder coating"), but it is understood that the present invention can be used to coat LEDs with other materials for down-conversion, protection, light extraction or scattering. It is also understood that the phosphor binder can have scattering or light extraction particles or materials, and that the coating can be electrically active. The methods according to the present invention can also be used for coating other semiconductor devices with different materials. Additionally, single or multiple coatings and/or layers can be formed on the LEDs and in different embodiments different ones of the coatings/layers can be formed on the LEDs at the wafer level or at the LED chip or package level. A coating can include no phosphors, one or more phosphors, scattering particles and/or other materials. A coating may also comprise a material such as an organic dye that provides down-conversion. With multiple coatings and/or layers, each one can include different phosphors, different scattering particles, different optical properties, such as transparency, index of refraction, and/or different physical properties, as compared to other layers and/or coatings. Each of the sequential phosphor layers can have only one phosphor or can have more than one phosphor, with different phosphors having the desired absorption and re-emission wavelength spectrum to minimize or eliminate re-absorption losses.

It is also understood that when an element such as a layer, region or substrate is referred to as being a "cover" or being "on", "over", "coating" or "covering" another element, it can be a direct cover or can be directly on, over, coating or covering on the other element, or intervening elements may also be present. Furthermore, relative terms such as "inner", "outer", "upper", "above", "lower", "beneath", "below", "on", "over" or "covering" and similar terms, may be used herein to describe a relationship of one layer or another region. It is understood that these terms are intended to encompass different orientations of the device in addition to the orientation depicted in the figures.

Although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the invention are described herein with reference to cross-sectional view illustrations that are schematic illustrations of embodiments of the invention. As such, the actual thickness of the layers can be different, and variations from the shapes of the illustrations as a result, for example, of manufacturing techniques and/or tolerances are expected. Embodiments of the invention should not be construed as limited to the particular shapes of the regions illustrated herein but are to include deviations in shapes that result, for example, from manufacturing. A region illustrated or described as square or rectangular will typically have rounded or curved features due to normal manufacturing tolerances. Thus, the regions illustrated in the figures are schematic in nature and their shapes are not intended to illustrate the precise shape of a region of a device and are not intended to limit the scope of the invention.

Figure 4:
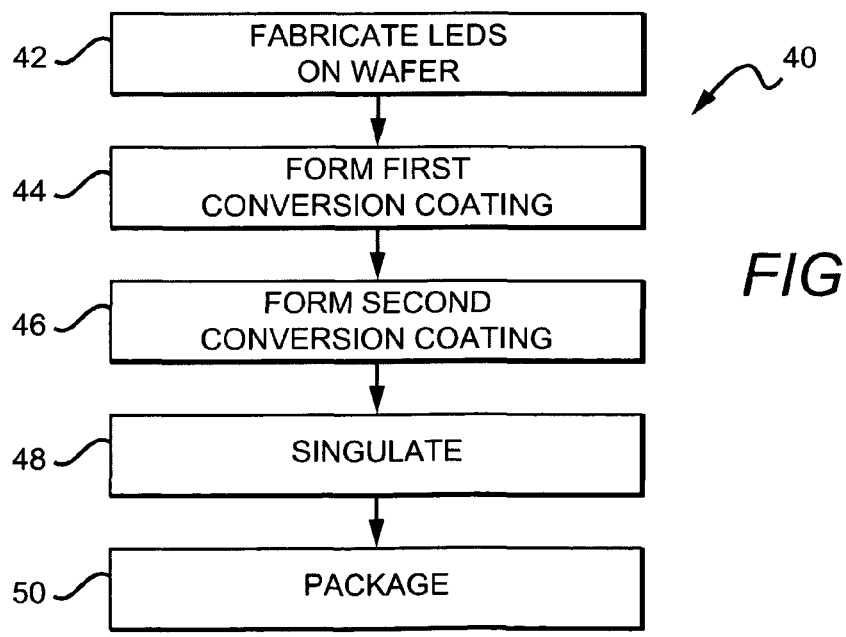
FIG. 4 shows one embodiment of a method for fabricating LED chips according to the present invention.

FIG. 4 shows one embodiment of method 40 according to the present invention for fabricating LEDs, and although the steps are being shown in a particular order it is understood that the steps can occur in a different order and different steps can be used. The present method is described with reference to the fabrication of LEDs, but it is understood that it can be used to fabricate other solid state emitters and other semiconductor devices. The present method is also described with reference to coating of LEDs at the wafer level, but it is understood that methods can also be used in coating LEDs at the chip or package level.

In 42 LEDs are fabricated on a growth wafer or substrate, and the LEDs can have many different semiconductor layers arranged in different ways. The fabrication and operation of LEDs is generally known in the art and only briefly discussed herein. The layers of the LEDs can be fabricated using known processes with a suitable process being fabrication using metal organic chemical vapor deposition (MOCVD). The layers of the LEDs generally comprise an active layer/region sandwiched between first and second oppositely doped epitaxial layers, all of which are formed successively on the growth wafer or substrate ("wafer"). The LED layers can initially be formed as continuous layers across the substrate with the layers then partitioned or separated into individual LEDs. This separation can be achieved by having portions of the active region and doped layers etched down to the wafer to form the open areas between the LEDs. In other embodiments the active layer and doped layers can remain continuous layers on the wafer and can be separated into individual devices when the LED chips are singulated.

It is understood that additional layers and elements can also be included in each of the LEDs, including but not limited to buffer, nucleation, contact and current spreading layers as well as light extraction layers and elements. The active region can comprise single quantum well (SQW), multiple quantum well (MQW), double heterostructure or super lattice structures, and as is understood in the art, the oppositely doped layers are commonly referred to as n-type and p-type doped layers.

The LEDs may be fabricated from different material systems, with preferred material systems being Group-III nitride based material systems. Group-III nitrides refer to those semiconductor compounds formed between nitrogen and the elements in the Group III of the periodic table, usually aluminum (Al), gallium (Ga), and indium (In). The term also refers to ternary and quaternary compounds such as aluminum gallium nitride (AlGaN) and aluminum indium gallium nitride (AlInGaN). In a preferred embodiment, the n- and p-type layers are gallium nitride (GaN) and the active region is InGaN. In alternative embodiments the n- and p-type layers may be AlGaN, aluminum gallium arsenide (AlGaAs) or aluminum gallium indium arsenide phosphide (AlGaInAsP).

The wafer can be made of many materials such as sapphire, silicon carbide, aluminum nitride (AlN), GaN, with a suitable wafer being a 4H polytype of silicon carbide, although other silicon carbide polytypes can also be used including 3C, 6H and 15R polytypes. Silicon carbide has certain advantages, such as a closer crystal lattice match to Group III nitrides than sapphire and results in Group III nitride films of higher quality. Silicon carbide also has a very high thermal conductivity so that the total output power of Group-III nitride devices on silicon carbide is not limited by the thermal dissipation of the wafer (as may be the case with some devices formed on sapphire). SiC wafers are available from Cree Research, Inc., of Durham, N.C. and methods for producing them are set forth in the scientific literature as well as in U.S. Pat. Nos. Re. 34,861; 4,946,547; and 5,200,022.

Each of the LEDs can also have first and second contacts. The LEDs can have vertical geometry with a first contact on the substrate and a second contact on the LEDs top layer, which is typically a p-type layer. The first and second contacts can comprise many different materials such as gold (Au), copper (Cu) nickel (Ni), indium (In), aluminum (Al) silver (Ag), or combinations thereof. In still other embodiments the contacts can comprise conducting oxides and transparent conducting oxides such as indium tin oxide, nickel oxide, zinc oxide, cadmium tin oxide, titanium tungsten nickel, indium oxide, tin oxide, magnesium oxide, $ZnGa_2O_4$, $ZnO_2/Sb$, $Ga_2O_3/Sn$, $AgInO_2/Sn$, $In_2O_3/Zn$, $CuAlO_2$, $LaCuOS$, $CuGaO_2$ and $SrCu_2O_2$. The choice of material used can depend on the location of the contacts as well as the desired electrical characteristics such as transparency, junction resistivity and sheet resistance. In the case of Group-III nitride devices, it is known that a thin semitransparent current spreading layer typically can cover some or the entire p-type layer. It is understood that the second contact can include such a layer which is typically a metal such as platinum (Pt) or a transparent conductive oxide such as indium tin oxide (ITO), although other materials can also be used. The present invention can also be used with LEDs having lateral geometry wherein both contacts are on the top of the LEDs. The LEDs can also comprise additional current spreading structures or grids.

In one embodiment, each of the LEDs can further comprise one or more pedestals each of which is provided to allow electrical contact to a respective one of the LED's contacts after phosphor coating of the LEDs. This embodiment is described in more detail below and in white chip patent applications U.S. patent application Ser. No. 11/656,759, and U.S. patent application Ser. No. 11/899,790, both entitled "Wafer Level Phosphor Coating Method and Devices Fabricated Utilizing Method", and both incorporated by reference as though fully set forth herein.

In an optional step, a good die map can be generated for the wafer based on a visual and electrical/optical inspection. The map can indicate the emission wavelengths for the LEDs across the wafer as well as LEDs that are defective. For example, a wafer of blue emitting LEDs can have a certain number of defective devices and in some embodiments the operating devices can experience emission wavelength variations of approximately 445 to 470 nm.

In 44, a first conversion coating/layer ("first conversion layer") is on the wafer that covers the LEDs, with the first coating in one embodiment comprising a conversion material in a binder. The first conversion layer can be applied using different known processes such as "glob" dispensing, electrophoretic deposition, electrostatic deposition, printing, jet printing or screen printing. In other embodiments the first conversion layer can be provided as a separately fabricated preform that can be bonded or mounted over the LEDs.

In one embodiment, the first conversion layer can be deposited over the wafer in a phosphor/binder mixture using spin coating. Spin coating is generally known in the art and generally comprises depositing the desired amount of binder and phosphor mixture at the center of the substrate and spinning the substrate at high speed. The centrifugal acceleration causes the mixture to spread to and eventually off the edge of the substrate. Final layer thickness and other properties of the first conversion layer depend on the nature of the mixture (viscosity, drying rate, percent phosphor, surface tension, etc.) and the parameters chosen for the spin process. For large wafers it may be useful to dispense the phosphor/binder mixture over the substrate before spinning the substrate at high speed.

In other embodiments, the first conversion layer can be deposited on the wafer using known electrophoretic deposition methods. The wafer and its LEDs are exposed to a solution containing phosphor particles suspended in a liquid. An electrical signal applied between the solution and the LEDs creates an electrical field that causes the phosphor particles to migrate to and deposit on the LEDs. The process typically leaves the phosphor blanketed over the LEDs in powder form. A binder can then be deposited over the phosphor with the phosphor particles sinking into the binder to form the first conversion layer. The binder can be applied using many known methods and in one embodiment, the binder coating can be applied using spin coating.

The first conversion layer can then be cured using many different curing methods depending on different factors such as the type of binder used. Different curing methods include but are not limited to heat, ultraviolet (UV), infrared (IR) or air curing. Different materials can be used for the binder, with materials preferably being robust after curing and substantially transparent in the visible wavelength spectrum. Suitable material include silicones, epoxies, glass, inorganic glass, spin-on glass, dielectrics, BCB, polymides, polymers and hybrids thereof, with the preferred material being silicone because of its high transparency and reliability in high power LEDs. Suitable phenyl—and methyl-based silicones are commercially available from Dow® Chemical. In other embodiments, the first coating can be textured or can be engineered to be index matched with the features such as the chip (semiconductor material) and growth substrate, which can reduce total internal reflection (TIR) and improve light extraction. Similarly, the surface of the LEDs can be textured to improve light extraction.

The first conversion layer preferably contains one or more light conversion materials that absorb light from the LEDs and re-emit light at a different wavelength, such as down-converting the light to a longer wavelength. Many different conversion materials can be used, with a suitable material being a first phosphor. Different factors determine the amount of LED light that will be absorbed by the first phosphor in the final LED chips, including but not limited to the size of the phosphor particles, the percentage of phosphor loading, the type of binder material, the efficiency of the match between the type of phosphor and wavelength of emitted light, and the thickness of the first coating. These different factors can be controlled to control the emission wavelength of the LED chips according to the present invention.

Many different phosphors can be used as the first phosphor. The present invention is particularly adapted to LED chips emitting white light including warm white light. In one embodiment according to the present invention the LEDs across a wafer can emit light in the blue wavelength spectrum, and red and yellow phosphors are used to produce the desired warm light hue. The phosphors absorb some of the blue light and re-emit yellow and red light, with the LED chips emitting a white light combination of blue and yellow and red light. In this embodiment, the first phosphor comprises a red phosphor and different materials can be used for the red phosphor including but not limited to:

$Sr_xCa_{1-x}S:Eu, Y; Y=halide$;
$CaSiAlN_3:Eu$; or
$Sr_{2-y}Ca_ySiO_4:Eu$

Different sized phosphor particles can be used including but not limited to 10-100 nanometer (nm)-sized particles to 20-30 µm sized particles, or larger. Smaller particle sizes typically scatter and mix colors better than larger sized particles to provide a more uniform light. Larger particles are typically more efficient at converting light compared to smaller particles because they are predominantly forward scattering, but can emit a less uniform light pattern. In one embodiment, the particle sizes are in the range of 2-15 µm. The coating can also have different concentrations or loading of phosphor materials in the binder, with a typical concentration being in the range of 30-70% by weight. In one embodiment, the phosphor concentration is approximately 65% by weight, and in some embodiments the phosphor is uniformly dispersed throughout the binder.

In 46 a second conversion coating/layer ("second conversion layer") can be formed on the first coating. The second conversion layer can comprise the same or similar binder as the first conversion layer, and can be applied and cured using the same methods. The second conversion layer, however, contains a different conversion material than the first conversion layer that preferably compliments the phosphor in the first coating by re-emitting light to provide the desired hue for the LED chips. The second phosphor should have an excitation spectrum that does not overlap with the emission spectrum of the first phosphor. In some embodiments there may be some minimal overlap between the excitation and emission spectrums of the first and second conversion layers.

In one embodiment the conversion material in the second conversion layer comprises a second phosphor that absorbs blue LED light and re-emits yellow light. Many different types of phosphors can be used such as commercially available YAG:Ce. A full range of broad yellow spectral emission is possible using conversion particles made of phosphors based on the $(Gd,Y)_3(Al,Ga)_5O_{12}:Ce$ system, such as the $Y_3Al_5O_{12}:Ce$ (YAG). Other yellow phosphors that can be used for white emitting LED chips include:

$Tb_{3-x}RE_xO_{12}:Ce$ (TAG); RE=Y, Gd, La, Lu; or
$Sr_{2-x-y}Ba_xCa_ySiO_4:Eu$.

The particular yellow phosphor should be chosen to compliment the phosphor being used for layers yet to be deposited on the wafer. The type and concentration of the yellow and red phosphors should be selected to provide the desired hue of white light, and the yellow phosphor should be selected.

It is understood that many different types of conversion materials emitting at different wavelengths of light can also be used alone or in combination with the phosphors mentioned above, and additional coatings can be included that contain these materials. For example, the following phosphors can be used to emit green saturated light:

$SrGa_2S_4:Eu$;
$Sr_{2-y}Ba_ySiO_4:Eu$; or
$SrSi_2O_2N_2:Eu$.

The following lists some additional suitable phosphors, although others can be used. Each exhibits excitation in the blue and/or UV emission spectrum, provides a desirable peak emission, has efficient light conversion, and has acceptable Stokes shift:

Yellow/Green
$(Sr,Ca,Ba)(Al,Ga)_2S_4:Eu^{2+}$
$Ba_2(Mg,Zn)Si_2O_7:Eu^{2+}$
$Gd_{0.46}Sr_{0.31}Al_{1.23}O_xF_{1.38}:Eu^{2+}_{0.06}$
$(Ba_{1-x-y}Sr_xCa_y)SiO_4:Eu$
$Ba_2SiO_4:Eu^{2+}$
Red
$Lu_2O_3:Eu^{3+}$
$(Sr_{2-x}La_x)(Ce_{1-x}Eu_x)O_4$
$Sr_2Ce_{1-x}Eu_xO_4$
$Sr_{2-x}Eu_xCeO_4$
$SrTiO_3:Pr^{3+},Ga^{3+}$
$CaAlSiN_3:Eu^{2+}$
$Sr_2Si_5N_8:Eu^{2+}$ It is understood that the conversion materials in first and second conversion layers can be different than those described above. Depending on the emission and excitation spectrums of the conversion materials, the conversion in the first conversion layer can absorb LED light and emit yellow light, while the conversion material in the second conversion layer can absorb LED light and can emit red light. In other embodiments different colors of light can be re-emitted from the conversion material. The overlap between the emission spectrum of the conversion material in the first conversion layer and the excitation spectrum of the second conversion layer should be minimized.

The first and second conversion layers can be formed using the same or different methods, and one or both can comprise a substantially uniform thickness layer across each of the LEDs or can comprise a conformal coat. In other embodiments, one or both of the first and second conversion layers can comprise a substantially non-uniform thickness layer such as typically provided by "glob" dispensing. For example, in one embodiment the first conversion layer can comprise a substantially uniform thickness layer deposited layer and the second conversion layer can be deposited using "glob" dispensing. In other embodiments the first conversion layer can be deposited using "glob" dispensing and the second conversion layer can be deposited using methods to provide conformal coating type layers having a varying thickness can depend on in some embodiment on the variations in the layer below it. Subsequent conversion layers can be deposited using any of these methods.

In 48 the individual LED chips can be singulated from the wafer using known methods such as dicing, scribe and breaking, or etching. The singulating process separates each of the LED chips and in 50 the singulated LED chips can optionally be mounted in a package, or to a submount or printed circuit board (PCB) without the need for further processing to add phosphor. In one embodiment the package/submount/PCB can have conventional package leads with the pedestals electrically connected to the leads. A conventional encapsulation can then surround the LED chip and electrical connections. In other embodiments the LED chip can be enclosed by a hermetically sealed cover with an inert atmosphere surrounding the LED chip at or below atmospheric pressure.

It is understood that additional steps can be included in the different embodiments of the methods according to the present invention. It is also understood that methods according to the present invention need not include all of the steps in the method 40 and the steps can be completed in different order. As described in further detail below, in some embodiments the first conversion layer can be deposited at the wafer level using any of the methods described above. The LEDs can then be singulated from the wafer into single LEDs or groups of LEDs, and following singulation the second conversion layer can be applied to the individual chips. For example, a first conversion layer having a red phosphor can be applied to the LEDs at the wafer level using one of the methods described above, and the wafer can then be singulated into LED chips. The individual LED chips can then be coated or can be coated after being packaged, such as by mounting to a submount. This process allows for the second conversion layer to be chosen to match with the emission of the LED with its first coating to achieve the desired emission characteristics for the LED chip. The emission variations that may occur from LED fabrication or coating of the LEDs as described above, can be considered when choosing the type of conversion material and thickness for the second conversion layer.

In the embodiments mentioned above where the LEDs comprise one or more pedestals to allow electrical contact to the LED's contacts after phosphor coating, or where the LEDs are otherwise arranged to allow electrical contact following coating, different methods according to the present invention can allow for simultaneous probing and micromachining to achieve the desired emission characteristics. That is, the micromachining can occur while the LED is probed and is emitting. This allows for real time controlled tuning at the wafer level without the need for generating a map of the wafer level emission characteristics.

Figure 5:
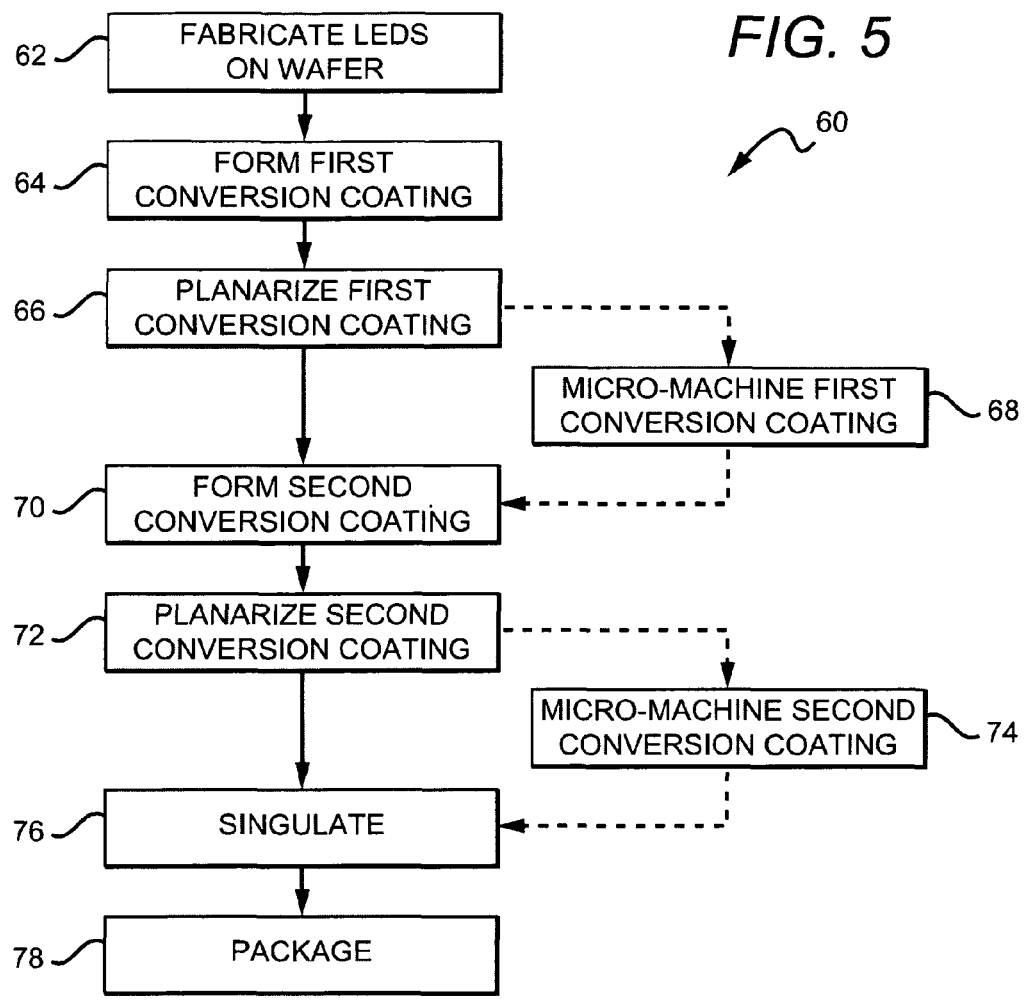
FIG. 5 shows another embodiment of a method for fabricating LED chips according to the present invention.

FIG. 5 shows another embodiment of a method 60 according to the present invention used for fabricating LEDs, and although steps are being shown in a particular order it is understood that the steps can occur in a different order and different steps can be used. The method 60 has many steps similar to those in method 40 above. Method 60 comprises a step 62 of fabricating LEDs on a growth wafer or substrate that is similar to the step 42 described above in method 40, and step 64 of forming a first conversion layer on the wafer that that is similar to step 44 above. Like the method 40, in this embodiment the first conversion layer comprises a red phosphor in a binder.

In 66 the first conversion layer can be ground or planarized as desired to remove some of the first coating. This can be done for different reasons, such as to control emission characteristics of the LED chips with less of the LED light being absorbed and re-emitted by the LED chips when there is less conversion material. Alternatively, this can be done to expose the pedestals on the LEDs across the wafer. This is particularly applicable to methods used to coat LEDs with pedestals, as described in U.S. patent application Ser. Nos. 11/656,759 and 11/899,790, both entitled "Wafer Level Phosphor Coating Method and Devices Fabricated Utilizing Method" and incorporated above. Different portions of the pedestals can be exposed and in some embodiments just the top of the pedestals are exposed. Many different thinning or planarizing processes can be used including known mechanical processes such as grinding, lapping or polishing, preferably after the binder has cured. Other fabrication methods can comprise a squeegee to thin the coating before cured or pressure planarization can also be used before the coating is cured. Still in other embodiments the coating can be thinned using physical or chemical etching, or ablation. The coating can have many different thicknesses following planarization, with a range of thicknesses in one embodiment being 1 to 100 μm.

In 68 an alternative step of micromachining the first coating can be performed to tune the emission characteristics by removing portions of the first conversion layer in selected areas. This is particularly applicable to methods of fabricating LEDs with pedestals where portions of the first coating are removed without removing additional portions of the pedestals. One purpose of this step can be removal of the first conversion layer between the pedestals to allow for the second conversion layer to be applied to the LEDs while still allowing for access to the pedestals. Without this step, the second conversion layer would bury the pedestals and planarizing the second conversion layer down the pedestals would result in all or most of the second conversion layer being removed. This step can also be used to tune the amount of first phosphor over the LED as described in U.S. Provisional Patent Application No. 61/072,546 entitled "Emission Tuning Methods and Devices Fabricated Utilizing Methods", incorporated by reference as though fully set forth herein.

Phosphor removal in 68 can be accomplished using several known techniques such as chemical, physical, mechanical etching and photo-ablation. There are several known techniques to chemically etch various phosphors and/or binding materials (resins, silicones, glass etc). Examples of physical etching include sputtering of the phosphor layer by high energy species. These could be plasma etching, physical sputtering using abrasive media such as polycarbonates, alumina, dry ice, etc. A selective area sandblasting or gas ($CO_2$) blasting can also be used where a nozzle crystallizes the gas as it exits, with the crystals used as the blasting compound. In each of these blasting embodiments, a mask can be used to protect the areas where the conversion layer thickness is not to be reduced by the sand or gas crystal blasting. Requiring a masking layer can increase the process steps and cost of etching techniques. Abrasive media should also be completely removed from the devices, which can require expensive vacuum removing techniques.

Another method that can be used according to the present invention is mechanical etching such as grinding/milling, drilling. This process can be less complicated and less costly than other processes and can utilize grinding and drilling bits of appropriate size, shape based on the machining application. Conversion layers over large area (such as a few millimeters), intermediate area (1-5 mm) and small area (less than 1 mm) can be removed in a single step on a CNC machine tool.

In other embodiments, the conversion layer can be removed by machining through laser ablation, which is a known process of removing material by irradiating it with a laser beam. Using a low laser flux, the material can be heated by the absorbed laser energy and evaporates or sublimates. At high laser flux, the material can be typically converted to a plasma. Laser ablation typically removes material with a pulsed laser, but it is possible to ablate material with a continuous wave laser beam if the laser intensity is high enough. In one embodiment, the material is removed in a series of holes formed in the conversion layer over the LED, with the number, depth and spacing of the holes determined by the target emission characteristics of the LED and the corresponding amount of conversion layer material to be removed to reach that target.

In still other embodiments, the conversion layer material can be removed by machining using micro drilling. This typically comprises using a mechanical drill to form holes in the conversion layer over the LEDs. Like laser ablation the number, depth and spacing of the holes is determined by the target emission characteristics of the LED and the amount of conversion layer material to be removed.

In 70 a second conversion layer is formed on the wafer that covers each of the LEDs comprising a conversion material in a binder. In 72, the second conversion layer can be planarized or thinned using the same processes as those described above in step 66, and can be performed for the same reasons such as to remove phosphor and/or to expose the pedestals. In optional step 74 the conversion layer can also be micromachined to further tune the emission characteristics of the LEDs, and the same micromachining processes can be used as those described in 68. In step 76 and 78 the LED chips can be singulated from the wafer and can be packaged as described in method 40.

In alternative embodiments of methods according to the present invention, the wafer can be probed at different points during fabrication to measure the output lighting characteristics of the LED chips across the wafer as described above. This can help determine the appropriate amount of the first and second conversion layers to remove to attain the desired output characteristics for the LED chips. In another alternative step a map of the output of the LEDs may be developed based on the output characteristics of the probed LEDs or regions of LEDs. This map can dictate different planarizing and mico-machining over individual LEDs or regions of LEDs based on the map showing the output characteristics. This allows for the physical thickness, and therefore, optical thickness of the conversion layers to be tuned based on the output characteristics of each of the LEDs across the wafer.

It is understood that additional steps can be included in the different embodiments of the methods according to the present invention. It is also understood that methods according to the present invention need not include all of the steps in the methods 40 and 60. In the embodiments mentioned above where the LEDs comprise one or more pedestals to allow electrical contact to the LED's contacts after phosphor coating with the conversion layers, or where the LEDs are otherwise arranged to allow electrical contact following coating, different methods according to the present invention can allow for simultaneous probing and micromachining to achieve the desired emission characteristics. That is, the micromachining can occur while the LED is probed and is emitting. This allows for real time controlled tuning at the wafer level without the need for generating a map of the wafer level emission characteristics.

In still other embodiments, a portion of the conversion layer can be micromachined at the wafer level to achieve emission within an acceptable range of the target emission characteristics. Individual LEDs can then be singulated from the wafer and then packaged, such as by mounting to a substrate or submount. Based on the desired emission color point for the package, final micromachining can be conducted at the package level. This process allows for the LEDs to be singulated and packaged, with the packages then being available for final micromachining to meet many different color points depending on customer demand. It is further understood that one or more of the conversion layers can also be deposited and micromachined at the LED chip or LED package level.

Methods according to the present invention can be utilized for machining many different devices, and FIGS. 6a through 6h show one embodiment of an LED wafer 80 fabricated according to the present invention. It is understood, however, that the present invention can be utilized to process many different LED embodiments and that individual LEDs, smaller groups of LEDs or LED packages can be processed similarly to the wafer level LED. Examples of different embodiments of LEDs that can be fabricated according to the invention include commercially available EZBright™ LED chips provided by Cree, Inc. (e.g. EZ1000, EZ700, EZ600, EZ400, EXBright290).

Figure 6A:
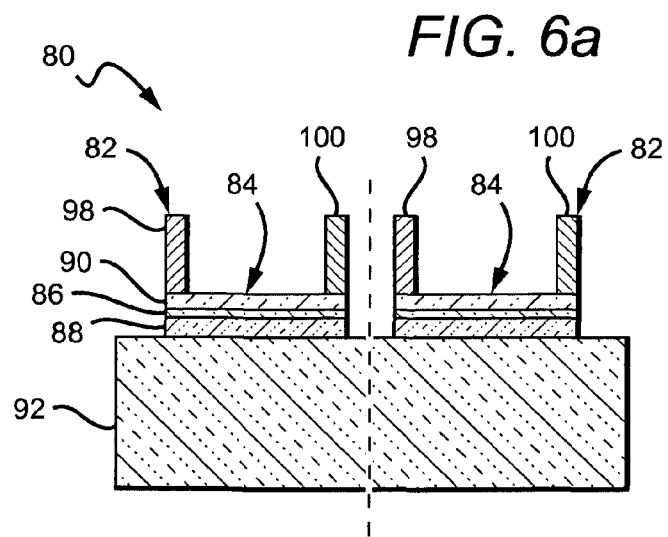
FIG. 6a is a sectional view of one embodiment of an LED chip wafer fabricated according to the present invention.

The details for fabrication of the LED wafer 80 are described in U.S. patent application Ser. Nos. 11/656,759 and 11/899,790, which are incorporated as provided above. Referring now to FIG. 6a, the LED wafer 80 comprises LED chips 82 shown at a wafer level of their fabrication process.

Phantom lines are included to show separation or dicing line between the LED chips 82 following additional fabrication steps. FIG. 6*a* shows only two devices at the wafer level, but it is understood that many more LED chips can be formed from a single wafer. For example, when fabricating LED chips having a 1 millimeter (mm) square size, up to 4500 LED chips can be fabricated on a 3 inch wafer.

Each of the LED chips 82 comprise a semiconductor LED 84 that can have many different semiconductor layers arranged in different ways as described above. The layers of the LEDs 84 generally comprise an active layer/region 86 sandwiched between first and second oppositely doped epitaxial layers 88, 90, all of which are formed successively on a substrate 92 at the wafer level. In the embodiment shown, the LEDs 84 are shown as separate devices on the substrate 92. This separation can be achieved by having portions of the active region 86 and doped layers 88, 90 etched down to the substrate 92 to form the open areas between the LEDs. In other embodiments, the active layer 86 and doped layers 88, 90 can remain continuous layers on the substrate 92 and can be separated into individual devices when the LED chips are singulated. The LEDs 84 can be made of different material systems as described above, and the substrate can be made of different materials. It is understood that additional layers and elements can also be included in the LED 84 and the active region 86 can comprise many different structures.

The LEDs 84 have lateral geometry, although it is understood that the invention is equally applicable to vertical geometry LEDs. Each of the LEDs 84 have first and second contacts each of which can be made of the materials described above, and each of the LEDs 84 can also comprise the current spreading layers and structures described above. Because the LEDs 84 have lateral geometry, both contacts are on the top of the LEDs 84.

Each of the LED chips 82 further comprise contact pedestals 98 and 100, both of which are utilized to make electrical contact to the LEDs 84. In the embodiment shown the pedestals 98, 100 make electrical contact to the LED's n-type layer, but it is understood that in other embodiments the pedestals 98, 100 can make contact to the p-type layer, or one of the pedestals 98, 100 can make contact to the p-type layer and the other can make contact to the n-type layer. The pedestals 98, 100 can be formed of many different electrically conductive materials and can be formed using many different known physical or chemical deposition processes such as electroplating, mask deposition (e-beam, sputtering), electroless plating, or stud bumping, with the preferred contact pedestal being gold (Au) and formed using stud bumping which is generally known in the art. The pedestals 98, 100 can be made of other conductive materials beyond Au, such as the metals utilized for the first and second contacts including Cu, Ni, In, combinations thereof, or the conducting oxides and transparent conducting oxides listed above. The height of the pedestals 98, 100 can vary depending on the desired thickness of the phosphor loaded binder coating and should be high enough to match or extend above the top surface of the phosphor loaded binder coating from the LED.

Figure 6B:
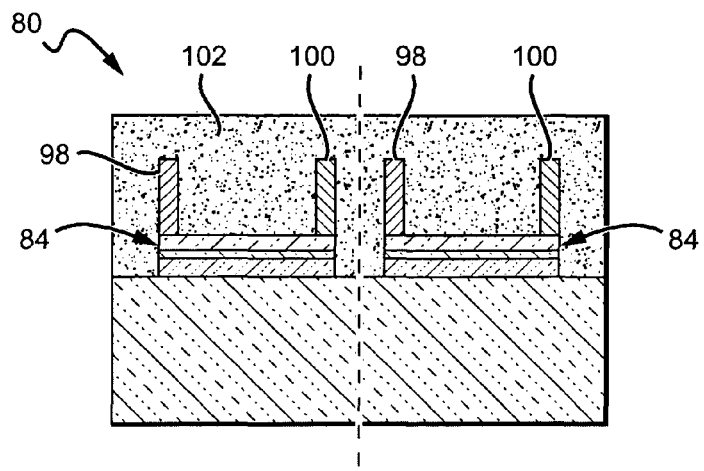
FIG. 6b is a sectional view of the LED chip wafer in FIG. 6a at a subsequent fabrication step.
Figure 6C:
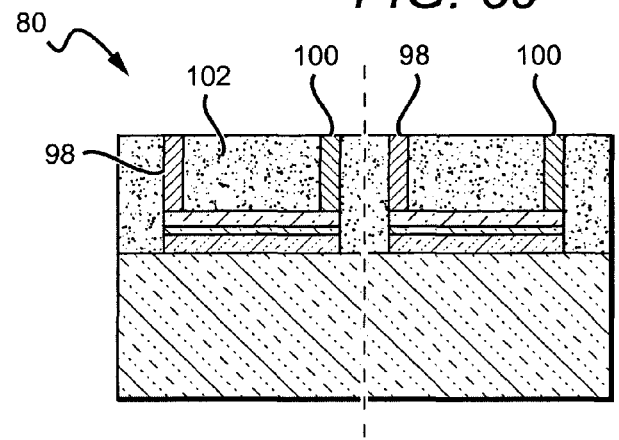
FIG. 6c is a sectional view of the LED chip wafer in FIG. 6b at a subsequent fabrication step.

Referring now to FIG. 6*b*, a first conversion layer 102 is formed on the LED wafer 80 using the methods described above. The first conversion layer 102 covers each of the LEDs 84, and has a thickness such that it buries the pedestals 98, 100. The first conversion layer 102 can then be cured using the methods described above and can comprise different binder and phosphor materials as also described above. In the embodiment shown, the first conversion layer can comprise red phosphor in a binder as described above. Referring now to FIG. 6*c*, after initial coating of the LEDs, the first conversion layer 102 is planarized or thinned using the methods described above to remove conversion material and to expose the pedestals 98, 100. In the embodiment shown, just the top of the pedestals are exposed, but it is understood that in other embodiments more of the pedestal can be exposed.

Figure 6D:
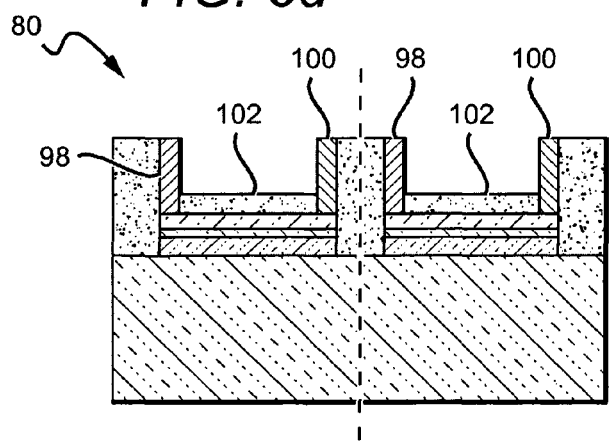
FIG. 6d is a sectional view of the LED chip wafer in FIG. 6c at a subsequent fabrication step.

Referring now to FIG. 6*d*, additional portions of the first conversion layer can be removed between the pedestals 98, 100 using the micromachining methods described above. This provides a space between the pedestals 98,100 for the second coating to fill and remain after the second coating is planarized.

Referring now to FIG. 6*e* a second conversion layer 104 is formed over the LEDs 84, on the first conversion layer 102. The second conversion layer can comprise many different materials such as those described above, and in the embodiment shown can comprise a yellow phosphor in a binder. The second conversion layer fills the space between the pedestals and buries the pedestals. Referring now to FIG. 6*f*, the wafer is again planarized to remove a portion of the second conversion layer 104 and to expose the pedestals 98, 100. The wafer can be micromachined over individual LEDs 84 or regions of LEDs to tune their emission characteristics as described above.

Referring now to FIG. 6*g*, the wafer can be singulated to separate the individual LED chips 82 along singlulation line 106 using known methods such as those described above with FIG. 6*h* showing the individual LED chips 82 following singulation. In the embodiment shown, each of the chips has a layer of red conversion material in the first conversion layer 102 and a layer of yellow phosphor in the second conversion layer. This arrangement minimizes or eliminates losses that can occur by light re-emitted from the yellow phosphor being re-absorbed by the red phosphor as it emits through the conversion material. The only yellow light that can be re-absorbed by the red phosphor is the light emitted from the yellow phosphor back toward the LED 84 that passes through the red phosphor. This is a relatively small amount of light from the yellow phosphor that typically does not contribute to useful emission from the LED chips 82.

In one embodiment, in order to minimize the amount of light from the yellow phosphor being backscattered towards the red phosphor, the yellow phosphor can have relatively large particles in relation to the wavelength of light emitted by the LED. In one embodiment, where the LED emits a blue wavelength of light (e.g. approximately 450 nm), phosphor particle sizes having a diameter greater than 10 µm would minimize backscattering. It is understood that many different sized phosphor particles can be used depending on the emission characteristics of the LED.

The side surfaces of the LEDs 84 and the pedestals are covered by only the first conversion layer, such that light emitting from the side surfaces of the LEDs 84 does not encounter the second conversion layer. In the embodiment shown the LED light encounters only the red phosphor of the first conversion layer and not the yellow phosphor of the second conversion layer. As a result, the side surfaces emit only blue LED light and red light re-emitted from the phosphor. However, the percentage of LED light emitted out the side surfaces is relatively small (<0.5%) so that the red emissions from the side surface do not impact the general color perception of the LED. LED light can also emit through the side surfaces of the submount, but this is also a relatively small percentage of overall light emitted from the LED.

In embodiments where it is desirable to reduce or eliminate this unconverted LED light emission out the submount side surfaces or the emission that encounters only one on conversion layer, different trench arrangements can be used at different points in the fabrication process. In one embodiment, trenches can be formed in the first conversion layer along the side surfaces of the LEDs with a portion of the first conversion layer remaining on the side surfaces. When the second conversion layer is formed it can fill the trenches. LED chips can be singulated along the trenches so that each of the LED chips can have a portion of the first and second conversion material along the side surfaces of the LED. In other embodiments trenches can be formed down through at least part of the submount before formation of the first conversion layer so that the first conversion layer can fill the trenches. The LED chips can then be singulated along the trenches leaving some of the first conversion layer on the side surfaces of the submount. In still other embodiments a second trench can be formed first conversion material after formation to fill the trenches in the submount. The second conversion layer can fill the second trenches so that the resulting singulated LED chips can have the first and second conversion material on the side surfaces of the submount. Trenches can also be formed from the bottom of the submount along the lines between the LED chips to aid in singulating.

As mentioned above, the LEDs 84 on the wafer can be probed at different points in the manufacturing process and the emission characteristics of each of the LEDs can be measured. As described above, probing can comprise making electrical contact to the exposed pedestals 98, 100 at each of the LEDs 84 and applying an electrical signal to the LEDs 84, causing them to emit light. A map of the emission characteristics of the wafer can be generated, that can be utilized to determine the amount and areas of macro or micro-machining needed for tuning each of the LEDs chips 82 so that they emit at or near a target emission.

In different embodiments one or more of the conversion layers can be applied at the LED chip or LED package level. FIGS. 7a through 7c show another embodiment of LED chips fabricated according to the present invention. Referring to FIG. 7a a LED wafer 120 is shown having features similar to that of LED chip wafer 80 shown in FIGS. 6a through 6h and described above. Only two LED chips 122 are shown, but it is understood that thousands of LED chips can be formed from a wafer. The LED wafer 120 comprises LED chips 122 having LEDs 124 formed on a substrate 126. Each of the LEDs has two pedestals 128, 130 similar to pedestals 98, 100 described above and shown in FIGS. 6a through 6f. The LED wafer 120 as shown in FIG. 7a is at a fabrication point similar to the LED wafer 80 as shown in FIG. 6d and described above. The first conversion layer 132 is included on the LEDs 124 with the first conversion layer 132 planarized to the pedestals 128, 130. The first conversion layer 132 is further between the pedestals 128, 130 using methods such as micromachining.

In this embodiment, however, the second conversion layer is not formed over the LED chips 122 at the wafer level. Instead, the LED wafer 120 is singulated into individual LED chips or groups of LED chips using the methods described above. FIG. 7b show an LED chip 122 singulated from the LED wafer 120 as shown in FIG. 7a. The second conversion layer 134 can then be deposited on the chip using the methods described above. In one embodiment the second conversion layer can be deposited using a conventional "glob" dispense method and can then be cured. Referring now to FIG. 7c, the second conversion layer 134 can be planarized to the pedestals 128, 130 to expose the pedestals 128, 130 for electrical contact. The second conversion layer 134 can be further micromachined to tune its emission. Although the LED chip 122 is shown having the second conversion layer 134 applied at the chip level it is understood that the second conversion layer can also be applied to the LED chip at the package level FIGS. 8a and 8b show an LED chip 142 similar to LED chip 122 in FIG. 7b that is singulated from an LED chip wafer prior to deposition of the second conversion layer. Referring first to FIG. 8a, a second conversion layer 146 is formed over the LED chip 142 covering the top surfaces of the LED chip 142 and at least some of the LED chip's side surfaces, such as by "glob" dispense methods. Referring to FIG. 8b, the second conversion layer 146 can then be planarized to the contact pedestals 148, 150, with the second conversion layer remaining on the LED 152 and at least some of the side surfaces of the LED chip 142. The conversion material on the side surfaces can provide the advantage of having the conversion material on the side surfaces to convert at least some of the LED light emitting out these surfaces.

As described above, by allowing for the second conversion layer to be applied at the LED chip or package level conversion material for the second coating can be chosen to match with the emission of the LED with its first coating to achieve the desired emission characteristics for the LED chip. In some embodiments the LED chip can be probed prior to formation of the second conversion layer, and the conversion material for the second conversion layer can be chosen based on the findings from probing and the desired emission wavelength and/or hue. The second conversion layer can also comprise a preform that can be matched to a particular LED to provide the desired end emission characteristics. Multiple preforms of different characteristics can be pre-fabricated to match with differing emission characteristics of the LED chips with a first conversion layer.

Although the embodiments above have been described with reference to two conversion layers being formed on the LED chips, it is equally applicable to LED chips or LED packages where more than two conversion layers are formed. For example, in LED chips where three conversion layers are to be formed, the first conversion layer can be formed at the wafer level and the subsequent layers can be formed at the LED chip or package level. In other embodiments the first and second layers can be formed at the wafer level and the third at the LED chip or package level. For LED chips where more conversion layers are used, different embodiments can have different combinations of wafer level and LED chip or package level layer formation.

Figure 9A:
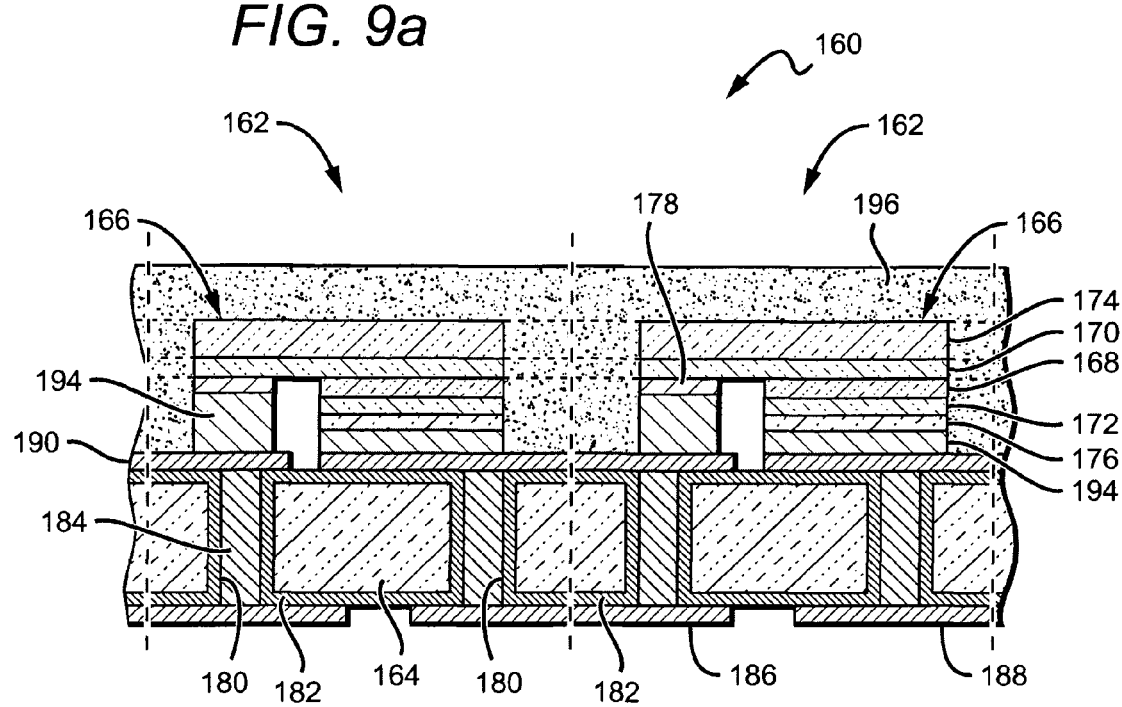
FIG. 9a is a sectional view of one embodiment of an LED chip wafer fabricated according to the present invention.
Figure 9B:
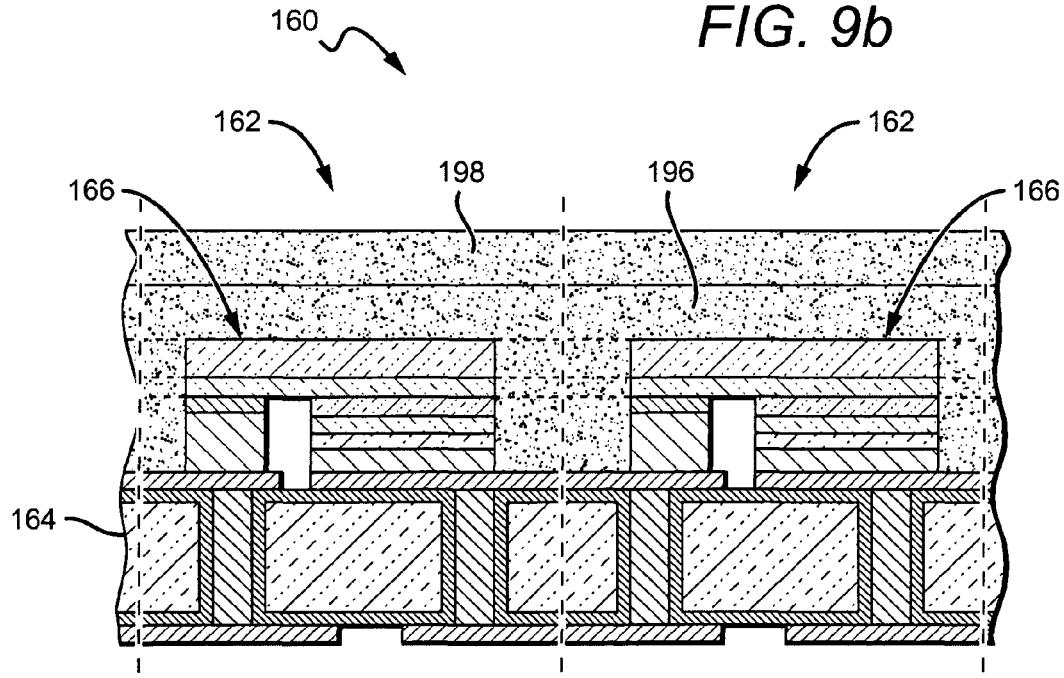
FIG. 9b is a sectional view of the LED chip wafer in FIG. 9a at a subsequent fabrication step.

As mentioned above, the present invention can be used with many different LED wafers and LED chip structures. FIG. 9a through 9c show another embodiment of an LED wafer 160 according to the present invention. Referring to FIG. 9a, the LED wafer 160 comprises LED chips 162 that are flip-chip mounted on submount 164 at the wafer level. The LED chips 162 are shown with phantom lines illustrating a separation or dicing line between the LED chips 162 following additional fabrication steps. Each of the LED chips 162 comprises a semiconductor LED 166 that can have many different semiconductor layers arranged in different ways as described above. As discussed above, the LEDs 166 generally comprise an active layer/region 168 sandwiched between first and second oppositely doped epitaxial layers 170, 172, all of which are formed successively on a substrate 174. The present invention is particularly adapted for use with LEDs arranged so that both contacts are accessible from one surface, such as with lateral geometry LEDs. Each of the LEDs 146 further comprises first and second electrodes or contacts 176, 178 on the first and second epitaxial layers respectively. Current spreading layers and structures can be included as described above.

Each of the LED chips 162 further comprise portions of the submount 164 arranged so that the LEDs 166 can be flip-chip mounted to it. The submount 164 can be made of many different materials, such as conducting or semiconducting materials or insulating materials. Some suitable materials include ceramics such as alumina, aluminum oxide, aluminum nitride or polymide. In other embodiments the submount wafer can comprise a printed circuit board (PCB), saffire or silicon, silicon carbide, or any other suitable material, such as commercially available T-Clad thermal clad insulated substrate material. The submount wafer 164 comprises a plurality of through-holes 180 that can be formed using known processes such as etching, with two or more of the through holes 180 arranged to cooperate with a respective one of the LEDs 166. In the embodiment shown, the through-holes 180 are arranged in sets of two, with each of the sets sized and spaced to align with the first and second contacts 176, 178 of a respective one of the LEDs 166.

A dielectric layer 182 can be included covering the surface of the submount 164, including the surfaces of the through-holes 180. The dielectric layer 182 electrically insulates the wafer such that electrical signals on the surfaces of the submount 164 do not spread into the submount 164. Different materials can be used for the dielectric layer, with suitable materials being silicon nitride or silicon oxide. For submount wafers made of an insulating material such as ceramic, it may not be necessary to include the dielectric layer for electrical isolation.

Each of the through-holes 180 can be filled with a conductive material to form conductive vias 184 through the submount 164. Each of the LED chips can have first and second bottom metal pads or traces 186, 188 on the bottom surface of its portion of the submount 164 that are arranged so that after dicing of the LED chips, they are electrically and physically separated by a space on the bottom surface. Each of the bottom traces 186, 188 is electrically coupled to a respective one of the vias 184. An electrical signal applied to the first bottom metal trace 186 is conducted to one of the LED chip's vias 184, with a signal applied to the second bottom metal trace 188 is conducted to the other of the LED chip's vias 184. Top traces 190 can be included on the top surface of the submount 164 for conducting signals from the vias 184 to the first and second contacts 176, 178. The LEDs 166 are mounted to the submount 164 by a conductive bond material 194, which is typically one or more bond/metal layers such as solder. The bond material typically bonds the first top trace 190 to the first contact 176 and the second top trace 192 to the second contact 178.

The LED wafer 160 can be covered by a first conversion layer 196 that is formed on the LED wafer 160 using the methods described above. The first conversion layer 196 can comprise the binder and phosphor materials described above and can be applied, cured and planarized as described above. In the embodiment shown, the LED chips 162 emit blue light and the first conversion layer 196 can comprise a red phosphor in a binder. The first conversion 196 can also be micromachined using the methods described above to remove portions of the first coating and to "tune" the emission characteristics of each of the LEDs chips 162. The LEDs wafer 160 can also be probed by contacting the first and second bottom traces 186, 188, causing the LEDs 166 to emit light. A map can be made of the emission characteristics of the LED chips across the wafer.

Referring now to FIG. 9b a second conversion layer 198 can then be formed on the LED wafer 160 using the methods described above. The second conversion layer 198 can also comprise the binder and phosphor materials described above and can be applied, cured, planarized and micromachined as described above. In the embodiment shown, the second coating can comprise a yellow phosphor in a binder. The LED chips 162 can again be probed to measure their output characteristics and can again be micromachined as needed so that the LED chips emit at or near a target emission characteristic. Referring now to FIG. 9c, the LED chips 162 can then be singulated from the LED wafer individually or as groups of LED chips 162. The LED chips 162 can then be further packaged as described above. It is understood that in other embodiments according to the present invention the LED chips 162 can have one or more conversion layers formed at the wafer level with subsequent layers formed at the LED chip or package level as described above.

In different embodiments the LED chip wafer can be further processed to enhance light extraction of the LED chips. In one embodiment, the surfaces of the LED and/or the surfaces of the conversion coatings can be textured or roughened to enhance light extraction. In other embodiments, additional layers can be included to further enhance light extraction.

FIG. 10 shows an LED chip wafer 210 fabricated according to the present invention that is similar to the LED chip wafer 80 shown in FIGS. 6a to 6h and for similar features the same reference numbers are used herein. The LED chip wafer comprises LED chips 212 having LEDs 84 formed on a substrate with n-type and p-type pedestals 98, 100. First and second conversion layers 102, 104 are formed over on the LED chips 212. In this embodiment a spacer layer 214 can be included between the LEDs 84 and the first coating 102, with the spacer layer 214 being made of material with lower refractive index (RI) than the first and second coatings 102, 104. This creates an RI step between the higher RI first coating 102 and lower RI spacer layer 214 that reduces the amount of light backscattered toward the LEDs 84 from entering the LED chips where it can be absorbed. The RI step promotes refraction of the backscattered light before it enters the LED chips 84.

The spacer layer 214 also helps to planarize the surface of the LED chips since the surface of the chip can be rough. In one embodiment, the spacer layer 214 is at least as thick as the height of the texture (~1 micron), but it is understood that the spacer layer can have many different thicknesses. The spacer layer 214 can be made of many different materials applied in many different ways, and can comprise multiple layers of different materials. In one embodiment, the spacer layer 214 comprises silicon spin coated on the surface of the LEDs 84.

It is understood that the present invention can be used with different LEDs and different coating arrangements having more than two conversion coatings. FIG. 11 shows an LED chip wafer 230 fabricated according to the present invention that is similar to the LED chip wafer 80 shown in FIGS. 6a to 6h and comprises LED chips 232. In this embodiment, however, the LEDs 84 have three conversion coatings, each can have a different phosphor in a binder. The first conversion coating 102 can comprise a red phosphor in a binder, and the second coating 104 can comprise a yellow phosphor in a binder, both of which are formed as described above. In this embodiment the yellow phosphor can be micromachined following planarization to form a space between the pedestals 98, 100. A third conversion coating/layer 234 is formed over the LED chips that fills the space between the pedestals and the third coating 234 is planarized. In the embodiment shown, the third coating 234 can comprise a green phosphor in a binder.

Light from the LED chips 84 passes through the first, second and third coatings where at least some of the light is converted by the phosphors in the coating. The LED chips emit a white light combination of red, yellow and green light, with the phosphors in emission and excitation spectrums such that light emitted from the red phosphor is not substantially reabsorbed by the yellow or green phosphors, and light emitted from the yellow phosphor is not substantially absorbed by the green phosphor.

There can be Many different variations of the embodiments in FIGS. 10 and 11. In one embodiment the LED wafer 230 in FIG. 11 can include a spacer layer between the LED chips and the first conversion layer as described above. The different conversion layers can also be formed at the wafer level, or at the LED chip or package level as described above.

Although the present invention has been described in detail with reference to certain preferred configurations thereof, other versions are possible. For example, the present invention can be used with many different device configurations (geometries, shape, size and other elements on, in and around the chip) to improve device performance. Therefore, the spirit and scope of the invention should not be limited to the versions described above.

I claim:

1. A light emitting diode (LED) chip wafer, comprising:
    a plurality of LEDs on a wafer;
    a first conversion layer on at least some of said LEDs, said first conversion layer comprising a first conversion material having an associated emission spectrum;
    a second conversion layer comprising a second conversion material having an associated excitation spectrum and arranged on said first conversion layer, said second conversion material being different than said first conversion material, wherein said first conversion material emission spectrum does not substantially overlap with said second conversion material excitation spectrum; and
    a plurality of pedestals, each of which is in electrical contact with one of said plurality of LEDs, at least some of said pedestals extending through said first and second conversion layers and exposed at the top surface of said layers.

2. The LED chip wafer of claim 1, wherein electrical contact is made to said LED chips through said pedestals.

3. A light emitting diode (LED) chip, comprising:
    an LED;
    a pedestal in electrical contact with said LED;
    a layer of first conversion material on said LED, said layer of first conversion material having an associated emission spectrum; and
    a layer of second conversion material on said layer of first conversion material, said second conversion material being different than said first conversion material and having an associated excitation spectrum, wherein said first conversion material emission spectrum does not substantially overlap with said second conversion material excitation spectrum, wherein said pedestal is configured to provide electrical connection to said LED.

4. The LED chip of claim 3, wherein said pedestal extends through and to the surface of said coatings.

5. The LED chip of claim 3, wherein said LED is on a substrate.

6. The LED chip of claim 3, wherein LED light is converted by said first conversion material into an emission spectrum.

7. The LED chip of claim 3, wherein said LED light is converted by said first conversion material according to said associated emission spectrum, and said second conversion material having said associated excitation spectrum, wherein said emission spectrum does not overlap with said excitation spectrum.

8. The LED chip of claim 3, wherein electrical contact is made to said LED chips through said pedestals.

9. The LED chip of claim 3, wherein said first and second conversion materials comprise phosphors.

10. The LED chip of claim 3, wherein said first conversion material is a red phosphor and said second conversion material is a yellow phosphor.

11. The LED chip of claim 3, wherein each of said LED chips emits a combination of LED light and first and second conversion material light.

12. The LED chip of claim 3, wherein said LED chips emit white light.

13. The LED chip of claim 3 wherein said pedestal comprises one or more stud bumps.

14. The LED chip of claim 3, further comprising a spacer layer between said LEDs and said layer of first conversion material.

15. A light emitting diode (LED) package comprising:
    an LED and a pedestal in electrical contact with said LED;
    a coating of first conversion material on said LED, said first conversion material having an associated emission spectrum;
    a coating of second conversion material on said coating of first conversion material, said second conversion material having an associated excitation spectrum, wherein said first conversion material emission spectrum does not substantially overlap with said second conversion material excitation spectrum;
    a package lead in electrical connection with said pedestal; and
    an encapsulation over said LED chip and electrical connection.

16. An LED package of claim 15, wherein said encapsulation comprises a hermetically sealed cover over said LED chip.

17. A light emitting diode (LED) chip wafer, comprising:
    a plurality of LEDs on a wafer;
    a plurality of pedestals each of which is in electrical contact with one of said LEDs;
    a layer of first conversion material on at least some of said LEDs, said first conversion material having an associated emission spectrum; and
    a layer of second conversion material on said layer of first conversion material, said second conversion material being different than said first conversion material and having an associated excitation spectrum, wherein said first conversion material emission spectrum does not substantially overlap with said second conversion material excitation spectrum.

18. The LED chip wafer of claim 17, wherein said first conversion material emission spectrum does not overlap with said second conversion material excitation spectrum.

19. The LED chip wafer of claim 17, wherein said first conversion material comprises a red phosphor and said second conversion material comprises a yellow phosphor.

20. The LED chip wafer of claim 17, wherein said first conversion material comprises a red phosphor and said second conversion material comprises a green phosphor.

21. The LED chip wafer of claim 17, wherein said first conversion material comprises a red phosphor and said second conversion material comprises a combination of yellow and green phosphors.

* * * * *